(12) United States Patent
Kimura et al.

(10) Patent No.: US 10,665,736 B2
(45) Date of Patent: May 26, 2020

(54) INFRARED LIGHT RECEIVING DEVICE, METHOD FOR FABRICATING INFRARED LIGHT RECEIVING DEVICE

(71) Applicant: SUMITOMO ELECTRIC INDUSTRIES, LTD., Osaka (JP)

(72) Inventors: Daisuke Kimura, Osaka (JP); Sundararajan Balasekaran, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/276,402

(22) Filed: Feb. 14, 2019

(65) Prior Publication Data
US 2019/0259891 A1 Aug. 22, 2019

(30) Foreign Application Priority Data
Feb. 16, 2018 (JP) .................................. 2018-026211

(51) Int. Cl.
| | |
|---|---|
| H01L 31/0352 | (2006.01) |
| H01L 31/18 | (2006.01) |
| H01L 31/0304 | (2006.01) |
| H01L 31/042 | (2014.01) |
| H01L 31/109 | (2006.01) |

(52) U.S. Cl.
CPC .. *H01L 31/035236* (2013.01); *H01L 31/0304* (2013.01); *H01L 31/03529* (2013.01); *H01L 31/035281* (2013.01); *H01L 31/184* (2013.01); *H01L 31/042* (2013.01); *H01L 31/109* (2013.01); *H01L 31/1828* (2013.01)

(58) Field of Classification Search
None
See application file for complete search history.

(56) References Cited

U.S. PATENT DOCUMENTS

2017/0040476 A1* 2/2017 Miura ............... H01L 27/14649

FOREIGN PATENT DOCUMENTS

JP 2001-144278 5/2001

* cited by examiner

*Primary Examiner* — Minh Loan Tran
(74) *Attorney, Agent, or Firm* — Smith, Gambrell & Russell, LLP.

(57) ABSTRACT

An infrared light receiving device includes: a structure having a supporting base and a laminate body, the laminate body including a first superlattice layer, a second superlattice layer and a semiconductor region, the first superlattice layer, the second superlattice layer and the semiconductor region being arranged sequentially on the supporting base, and the laminate body having an array of semiconductor mesas for photodiodes and a recess defining the array of semiconductor mesas; and a first electrode connected to the first superlattice layer. The first superlattice layer has an n-type conductivity. The semiconductor region has a p-type conductivity. The first superlattice layer has a type-II superlattice structure and forming a heterojunction with the supporting base. The recess has first and second recess portions. The second recess portion has a bottom in the first superlattice layer. The first recess portion has a depth larger than that of the second recess portion.

7 Claims, 20 Drawing Sheets

Fig.1
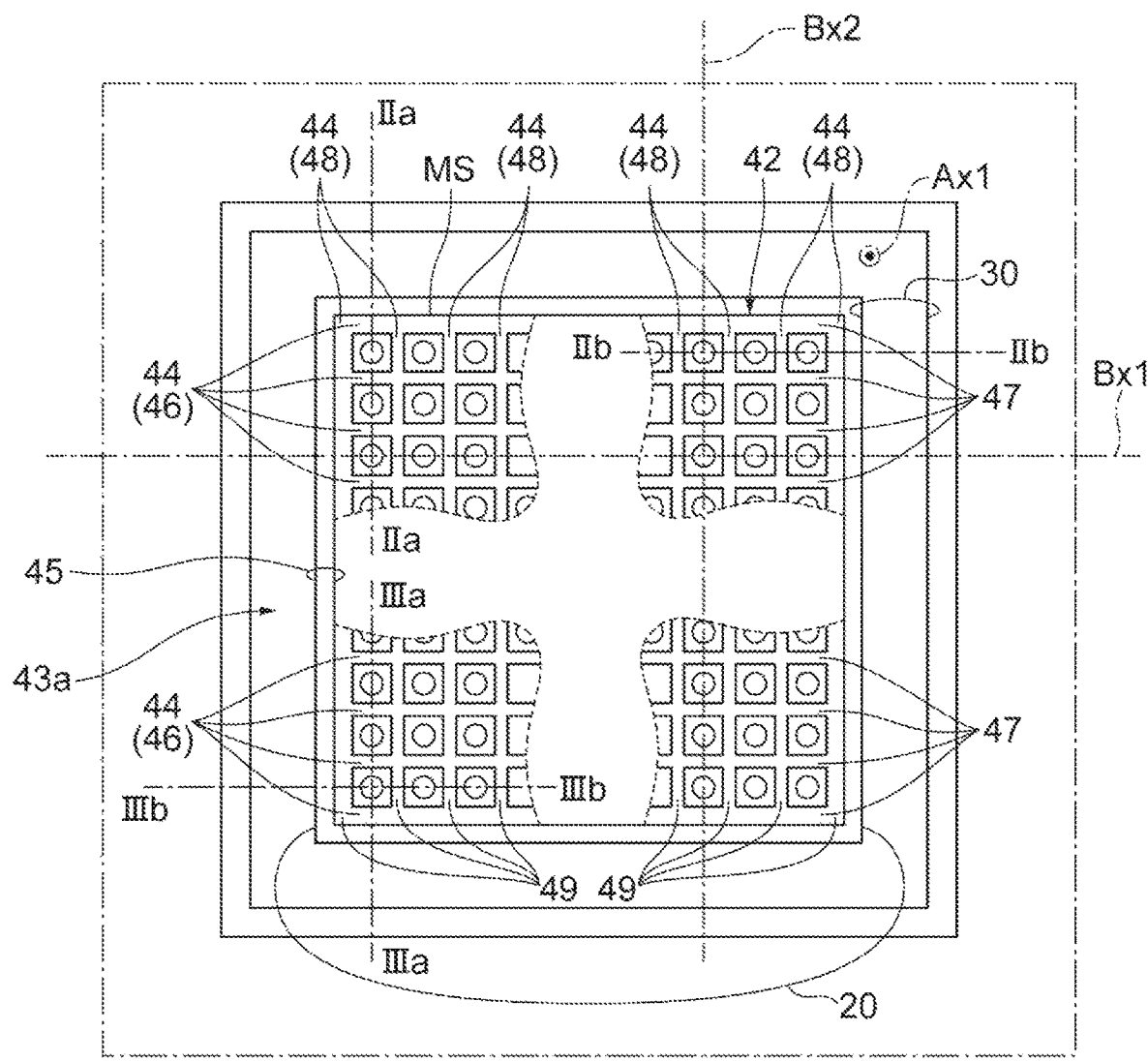
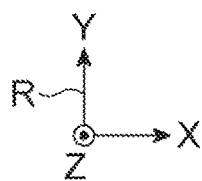

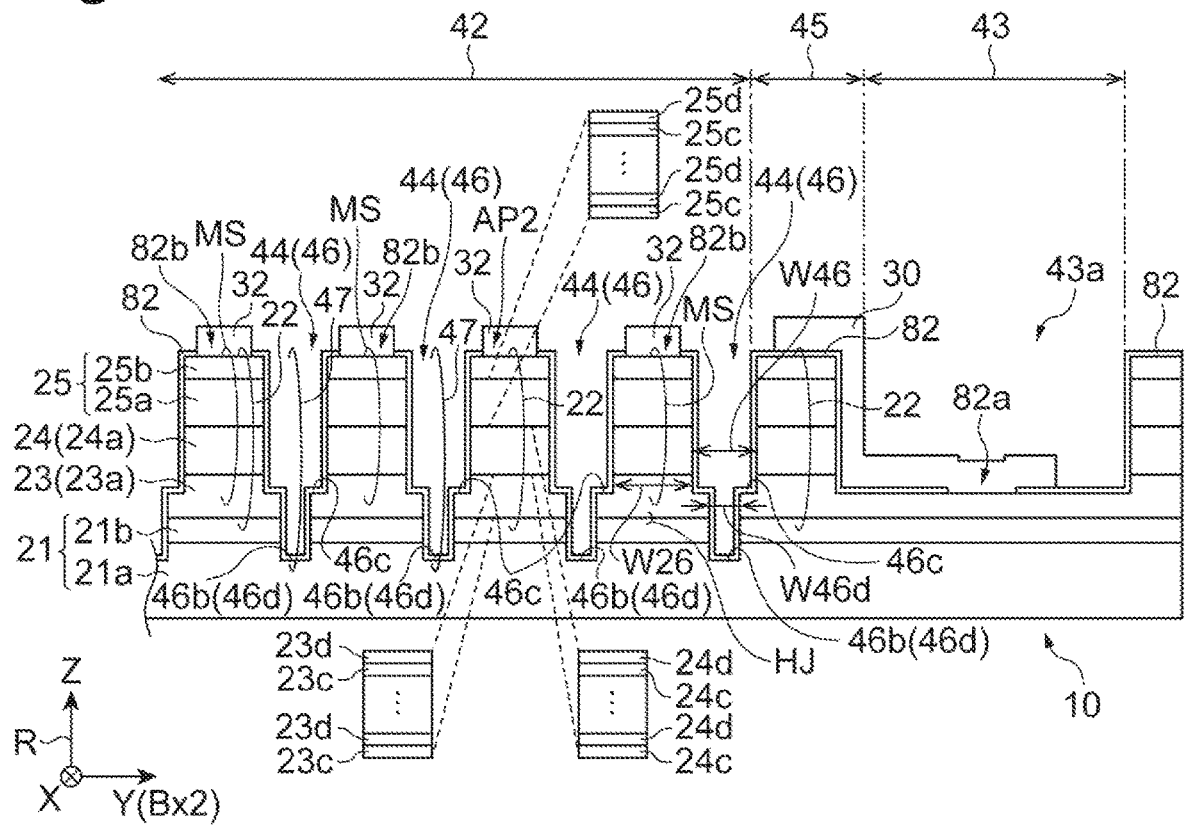
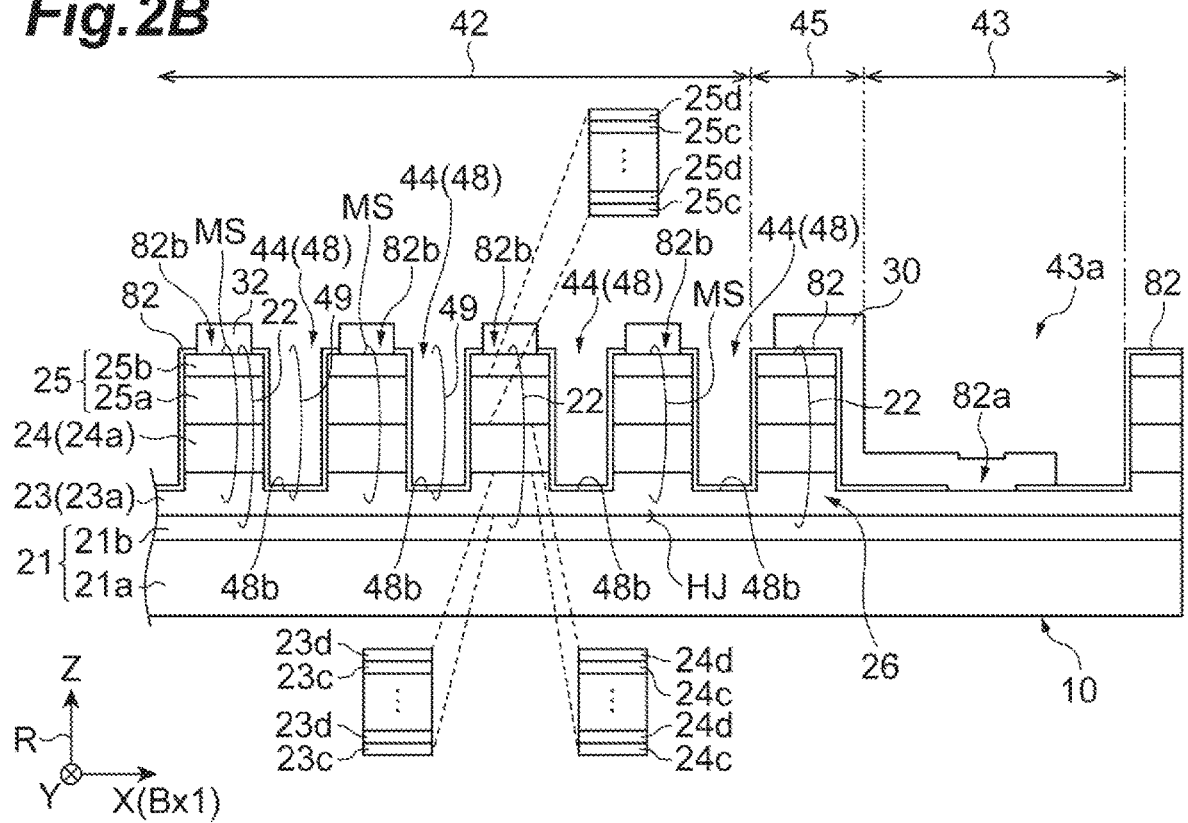

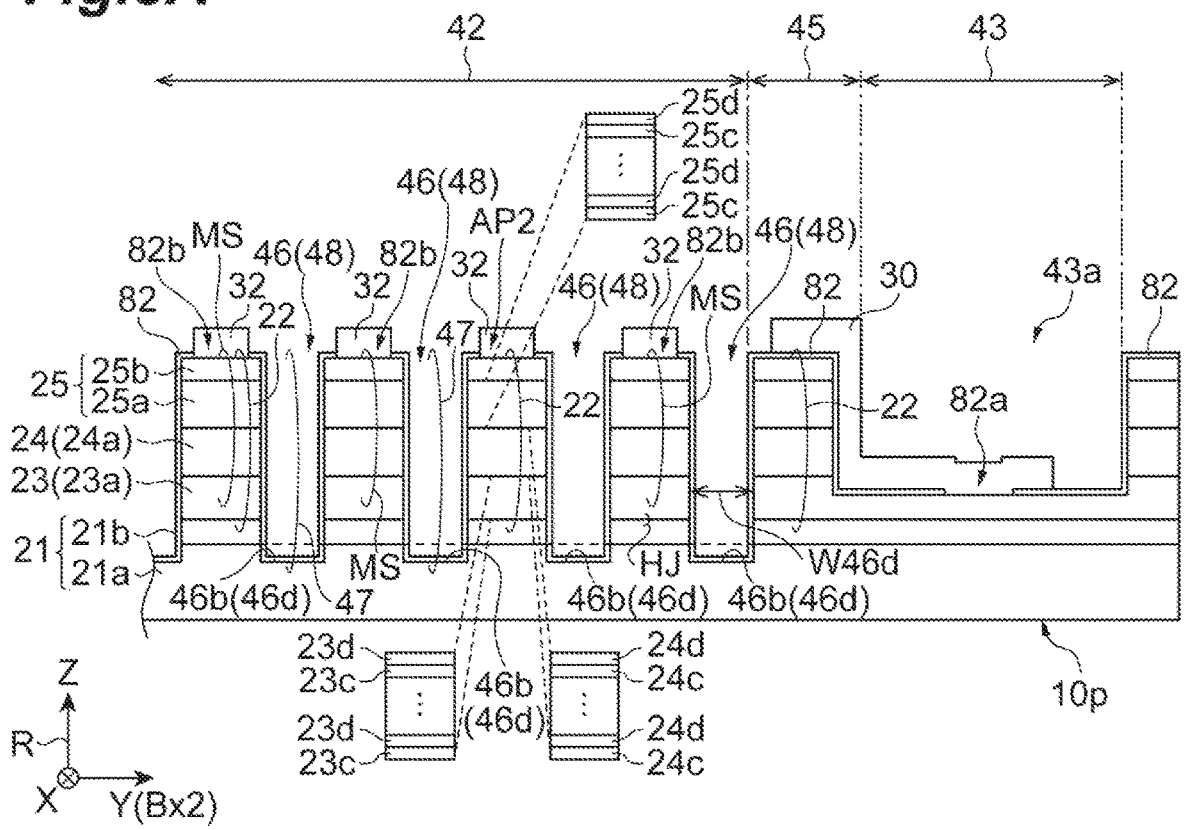
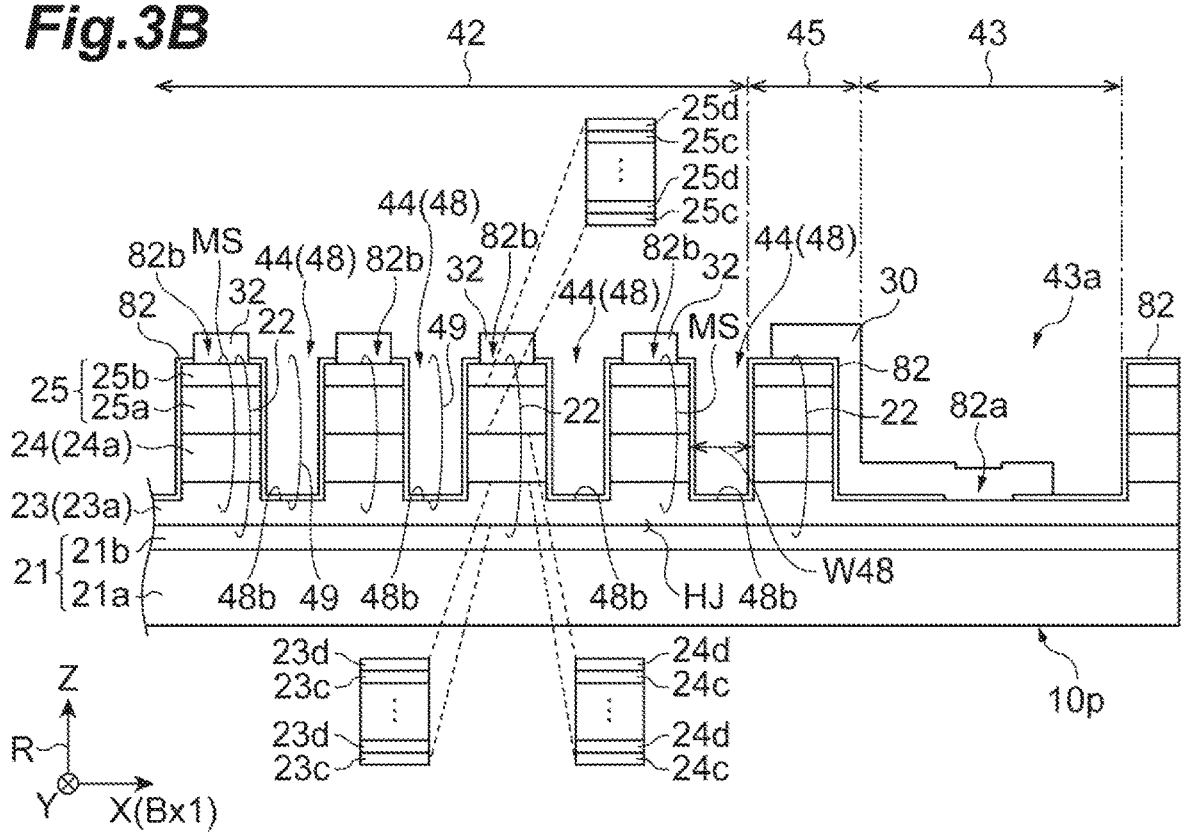

INFRARED LIGHT RECEIVING DEVICE, METHOD FOR FABRICATING INFRARED LIGHT RECEIVING DEVICE

BACKGROUND OF THE INVENTION

Field of the Invention

The present invention relates to an infrared light receiving device and a method for fabricating an infrared light receiving device. This application claims the benefit of priority from Japanese Patent application No. 2018-026211 filed on Feb. 16, 2018, which is herein incorporated by reference in its entirety.

Related Background Art

Japanese Unexamined Patent Application Publication No. 2001-144278, referred to as Patent Document 1, discloses a light receiving element array.

SUMMARY OF THE INVENTION

An infrared light receiving device according to one aspect of the present invention includes: a structure having a supporting base and a laminate body, the laminate body including a first superlattice layer, a second superlattice layer and a semiconductor region, the first superlattice layer, the second superlattice layer and the semiconductor region being arranged sequentially on the supporting base, and the laminate body having an array of semiconductor mesas for photodiodes and a recess defining the array of semiconductor mesas; and a first electrode connected to the first superlattice layer. The first superlattice layer has an n-type conductivity, and the semiconductor region has a p-type conductivity. The first superlattice layer has a type-II superlattice structure and forms a heterojunction with the supporting base. The recess has a first recess portion and a second recess portion. The second recess portion has a bottom in the first superlattice layer, and the first recess portion has a depth larger than that of the second recess portion.

A method for fabricating an infrared light receiving device according to another aspect of the present invention includes: preparing an epitaxial substrate having a substrate and a semiconductor laminate body, the semiconductor laminate body having a first superlattice, a second superlattice and a semiconductor region, and the substrate mounting the semiconductor laminate body; and processing the epitaxial substrate by photolithography and etching to form a recess in the epitaxial substrate, the recess defining an array of semiconductor mesas for photodiodes. The first superlattice, the second superlattice and the semiconductor region are arranged sequentially on the substrate. The first superlattice has an n-type conductivity, and the semiconductor region has a p-type conductivity. The first superlattice has a type-II superlattice structure and forms a heterojunction with the substrate. The recess has a first recess portion and a second recess portion. The second recess portion has a bottom in the first superlattice, and the first recess portion has a depth larger than that of the second recess portion.

BRIEF DESCRIPTION OF THE DRAWINGS

The above-described objects and the other objects, features, and advantages of the present invention become more apparent from the following detailed description of the preferred embodiments of the present invention proceeding with reference to the attached drawings.

FIG. 1 is a schematic plan view showing an infrared light receiving device according to an embodiment.

FIG. 2A is a schematic cross sectional view, taken along line IIa-IIa shown in FIG. 1, showing an infrared light receiving device according to the embodiment.

FIG. 2B is a schematic cross sectional view, taken along line IIb-IIb shown in FIG. 1, showing the infrared light receiving device according to the embodiment.

FIG. 3A is a schematic cross sectional view, taken along line shown in FIG. 1, showing an infrared light receiving device according to the embodiment.

FIG. 3B is a schematic cross sectional view, taken along line IIIb-IIIb shown in FIG. 1, showing the infrared light receiving device according to the embodiment.

DESCRIPTION OF THE EMBODIMENTS

Figure 4A:
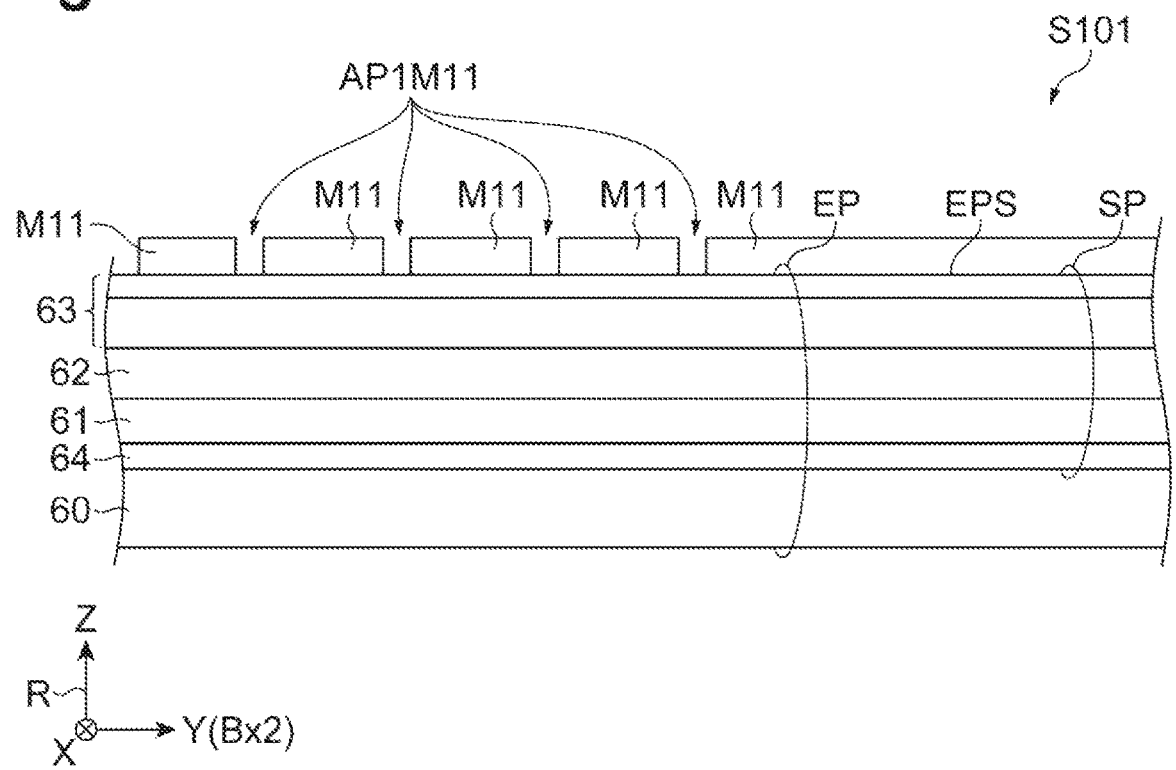
FIG. 4A is a schematic cross sectional view showing a major step in a method of fabricating the infrared light receiving device according to the embodiment.

Patent Document 1 discloses an array of light receiving elements. This light receiving array is formed by etching to form a mesa structure. Patent Document 1 discloses that the etching process is stopped in the middle of semiconductor for the light absorbing layer to form the mesa structure, so that the n-type InP layer, which is under the light-absorbing layer, and the n-type InP substrate, which is just under the n-type InP layer, are left without being etched.

The inventors' findings reveal that in a semiconductor light receiving device that includes a III-V semiconductor light-absorbing layer of a type-II superlattice and a III-V semiconductor superlattice layer disposed thereunder, this III-V semiconductor superlattice layer generates undesired generation/recombination current. In view of fabrication of the semiconductor light absorbing device, the fabricating method includes etching the superlattice structure for the group III-V semiconductor light-absorbing layer to form a semiconductor mesa containing a part of the III-V semiconductor light-absorbing layer, i.e., controlling the etching so as to stop it in the middle of the superlattice structure, so that the etching does not change the volume of the III-V semiconductor superlattice layer before and after the etching. This mesa structure cannot make the generation/recombination current from the III-V semiconductor superlattice layer reduced below a desired level to improve light receiving sensitivity of semiconductor light receiving elements in the array. One of solutions to provide a semiconductor light receiving element with an improved light receiving sensitivity is to reduce the volume of the group III-V semiconductor superlattice layer in the array of semiconductor light receiving elements. For example, reducing the size and pitch of the light receiving elements in the array can make the volume of the group III-V semiconductor superlattice layer therein.

A description will be given of examples according to the embodiment.

An infrared light receiving device according to an example includes: (a) a structure having a supporting base and a laminate body, the laminate body including a first superlattice layer, a second superlattice layer and a semiconductor region, the first superlattice layer, the second superlattice layer and the semiconductor region being arranged sequentially on the supporting base, and the laminate body having an array of semiconductor mesas for photodiodes and a recess defining the array of semiconductor mesas; and (b) a first electrode connected to the first superlattice layer. The first superlattice layer has an n-type conductivity, and the semiconductor region has a p-type conductivity. The first superlattice layer has a type-II superlattice structure and forms a heterojunction with the supporting base. The recess has a first recess portion and a second recess portion. The second recess portion has a bottom in the first superlattice layer, and the first recess portion has a depth larger than that of the second recess portion.

The infrared light receiving device allows the first recess portion to have a bottom deeper than that of the second recess portion, which is provided with the bottom located in the first superlattice layer, and making recess portions deeper than the second recess portion can reduce the volume of the first superlattice layer. This reduction leads to lowering the amount of generation/recombination current in the first superlattice layer, and providing the second recess portion with the bottom within the first superlattice layer allows the first superlattice layer to connect semiconductor mesas in the array with each other via the first superlattice layer. This interconnection in the arrayed semiconductor mesas allows the first electrode to receive carriers from the arrayed semiconductor mesas through the first superlattice layer.

In the infrared light receiving device according to an example, the first recess portion has a bottom in the supporting base.

The infrared light receiving device provides the first recess portion, which penetrates the first superlattice layer and the heterojunction, with the bottom within the supporting base.

In the infrared light receiving device according an example, the recess has first grooves each extending in a direction of a first axis and second grooves each extending in a direction of a second axis intersecting the first axis; each of the first grooves has a depth allowing the first groove to form the first recess portion; and each of the second grooves has a depth allowing the second groove to form the second recess portion.

The infrared light receiving device provides the first and second grooves with respective depths different from each other to reduce the volume of the first superlattice layer.

In the infrared light receiving device according to an example, the first superlattice layer has strip portions each extending in a direction of a first axis; and the first electrode is connected with the strip portions.

The infrared light receiving device is provided with the arrangement of the strip-shaped portions of the first superlattice layer, and such arrangement enables both the reduction of the volume of the first superlattice layer and the connection of the semiconductor mesas to the first electrode through the first superlattice layer.

A method for fabricating an infrared light receiving device according to an example includes: (a) preparing an epitaxial substrate having a substrate and a semiconductor laminate body, the semiconductor laminate body having a first superlattice, a second superlattice and a semiconductor region, and the substrate mounting the semiconductor laminate body; and (b) processing the epitaxial substrate by photolithography and etching to form a recess in the epitaxial substrate, the recess defining an array of semiconductor mesas for photodiodes. The first superlattice, the second superlattice and the semiconductor region are arranged sequentially on the substrate. The first superlattice has an n-type conductivity, and the semiconductor region has a p-type conductivity. The first superlattice has a type-II superlattice structure and forms a heterojunction with the substrate. The recess has a first recess portion and a second recess portion. The second recess portion has a bottom in the first superlattice, and the first recess portion has a depth larger than that of the second recess portion.

The method for making an infrared light receiving device includes forming multiple recess portions, which define an array of semiconductor mesas, having different depths. Specifically, the first recess portions each have a bottom deeper than each of the second recess portions, which is provided with a bottom in the first superlattice layer, and recess portions deeper than the second recess portion can reduce the volume of the first superlattice layer. This reduction in volume of the first superlattice layer leads to decrease in the amount of generation/recombination current, and the remaining part of the first superlattice layer can provide the second recess portion with a bottom in the first superlattice layer to interconnect the arrayed semiconductor mesas to each other via the first superlattice layer. This interconnection allows photo carriers to flow from the arrayed semiconductor mesas to the electrode through the first superlattice layer.

The method according to an example may provide processing the epitaxial substrate by photolithography and etching to form a recess in the epitaxial substrate with the following steps: forming a first mask on the epitaxial substrate, the first mask having an opening extending in a direction of a first axis; forming a third recess portion in the epitaxial substrate by processing the epitaxial substrate with the first mask to obtain a first substrate product, the third recess portion having a depth smaller than that of each of the first and second recess portions; forming a second mask on the first substrate product, the second mask having a first opening and a second opening, the first opening extending in a direction of a first axis, and the second opening extending in a direction of a second axis intersecting the first axis; processing the first substrate product with the second mask to form the first recess portion and the second recess portion in the first substrate product; and removing the second mask to obtain a second substrate product having the first recess portion and the second recess portion. The first and second openings of the second mask define respective locations of the first and second recess portions. The second mask is aligned with the substrate product such that the first opening thereof is disposed on the opening of the first mask.

The method includes performing the first process using the first mask to form a third recess portion shallower than the first and second recess portions and then performing the second process using the second mask to form the second recess portion having a depth. The second process, which can form the second recess portion, is also applied to the third recess portion, so that these processes allows the first and second recess portions to have respective depths different from each other.

The method according to an example may provide processing the epitaxial substrate by photolithography and etching to form a recess in the epitaxial substrate with the following steps: forming a first mask on the epitaxial substrate, the first mask having a first opening; applying a first etching to the epitaxial substrate with the first mask; after applying the first etching to the epitaxial substrate, removing the first mask to form a first substrate product; after removing the first mask, forming a second mask on the first substrate product, the second mask having a second opening; applying a second etching to the first substrate product with the second mask; and after applying the second etching to the first substrate product, removing the second mask to form a second substrate product. One of the first etching and the second etching uses a first etching condition to form the first recess portion, and the other of the first etching and the second etching uses a second etching condition to form the second recess portion.

The method includes forming the second substrate product, which includes the first and second recess portions, by the first and second etching processes. One of the first and second etching processes uses the first etching recipe that enables the one etching to form the first recess portion having a first depth, and the other of the first and second etching processes uses a second etching recipe that enables the other etching to form the second recess portion having a second depth.

Teachings of the present invention can be readily understood by considering the following detailed description with reference to the accompanying drawings shown as examples. Referring to the accompanying drawings, an infrared light receiving device, and a method for fabricating an infrared light receiving device according to examples of the present embodiment will be described below. To facilitate understanding, identical reference numerals are used, where possible, to designate identical elements that are common to the figures.

FIG. 1 is a schematic plan view showing an infrared light receiving device according to the embodiment. FIG. 2A is a schematic cross sectional view taken along line IIa-IIa shown in FIG. 1, and FIG. 2B is a schematic cross sectional view taken along line IIb-IIb shown in FIG. 1. FIG. 3A is a schematic cross sectional view taken along line IIIa-IIIa shown in FIG. 1, and FIG. 3B is a schematic cross sectional view taken along line IIIa-IIIa shown in FIG. 1. Referring to FIG. 1, FIGS. 2A and 2B, and FIGS. 3A and 3B, an orthogonal coordinate system R is drawn in each figure. A description will be given of an infrared light receiving device 10 with reference to FIG. 1. Specifically, the infrared light receiving device 10 according to the present embodiment, however, may be provided with either the structure shown in FIGS. 2A and 2B or the structure shown in FIGS. 3A and 3B.

The infrared light receiving device 10 includes a semiconductor structure 20 and a first electrode 30. The semiconductor structure 20 has a supporting base 21 and a laminate body 22 on the supporting base 21. The laminate body 22 includes a first superlattice layer 23, a second superlattice layer 24, and a semiconductor region 25. The semiconductor structure 20 has a recess 44 and semiconductor mesas MS for photodiodes, and the semiconductor mesas MS are arranged to form an array 42. The array 42 is provided in the laminate body 22. The recess 44 defines the array 42 of semiconductor mesas MS. In particular, the recess 44 extends so as to form the semiconductor mesas MS. The first electrode 30 is connected to the first superlattice layer 23 of the laminate body 22.

The first superlattice layer 23 and the semiconductor region 25 are provided with n-type and p-type conductivities, respectively. The first superlattice layer 23 has a type-II structure and forms a heterojunction HJ with the supporting base 21. The second superlattice layer 24 has a type-II structure which can absorb light in infrared wavelengths to generate photo carriers. The semiconductor region 25 also has a type-II superlattice structure.

The recess 44 includes multiple first recess portions 46 and multiple second recess portions 48. The first recess portions 46 each are deeper than the second recess portions 48, and the second recess portions 48 each have a bottom 48b in the first superlattice layer 23.

The infrared light receiving device 10 provides the first recess portions 46 with a bottoms 46b, and provides the second recess portions 48 with a bottom 48b. The bottom 46b is deeper than the bottom 48b, which is located in the first superlattice layer 23. The recess portions deeper than the second recess portions 48 make the volume of the first superlattice layer 23 in the laminate body 22 reduced. The reduction in volume can lower the amount of generation/recombination current that the first superlattice layer 23 generates. The second recess portions 48 each are provided with the bottom 48b in the first superlattice layer 23, which connects the semiconductor mesas MS in the array 42 with each other. This connection allows the first electrode 30 to receive photo carriers from the semiconductor mesas MS via the first superlattice layer 23 in the array 42.

Referring to FIG. 1, the recess 44 has an opening allowing the arrangement of the semiconductor mesas MS to form a two-dimensional array, and if necessary, a one-dimensional array.

Subsequently, a detailed description will be given of the infrared light receiving device 10.

The supporting base 21 includes a substrate 21a, such as an n-type GaSb substrate. If necessary, the supporting base 21 may further include a buffer layer 21b, which is disposed on the substrate 21a.

The first superlattice layer 23 includes a stack of unit structures, each of which includes a first III-V semiconductor layer 23c and a second III-V semiconductor layer 23d having respective bandgaps different from each other. The first superlattice layer 23 has a type II structure. In the embodiment, each unit structure may be made of, for example, n-type GaSb/InAs.

The first superlattice layer 23 may be provided with the n-type GaSb/InAs superlattice, which forms a heterojunction HJ with the supporting base 21, specifically n-type GaSb of the buffer layer 21b. The heterojunction HJ produces a hetero-barrier at the interface between the buffer layer 21b and the n-type GaSb/InAs superlattice 23a. The n-type GaSb/InAs superlattice makes contact with the first electrode 30, for example, the cathode electrode.

The second superlattice layer 24 includes a stack of unit structures, each of which includes a third III-V semiconductor layer 24c and a fourth III-V semiconductor layer 24d having respective bandgaps different from each other. The second superlattice layer 24 has a type-II structure acting as a light absorber 24a. In the embodiment, each unit structure may include, for example, GaSb/InAs.

The semiconductor region 25 includes a type-II superlattice layer 25a. The superlattice layer 25a has a stack of unit structures, each of which includes a fifth III-V semiconductor layer 25c and a sixth III-V semiconductor layer 25d having respective bandgaps different from each other. In the embodiment, each unit structure may include, for example, GaSb/InAs. If necessary, the semiconductor region 25 may further have a p-type contact layer 25b on the superlattice layer 25a. The p-type contact layer 25b may include, for example, a p-type GaSb, and the p-type GaSb contact layer 25b makes contact with a second electrode 32, such as an anode electrode, which is disposed on the semiconductor region 25.

In the embodiment, the second recess portions 48 each have a bottom 48b in the first superlattice layer 23. The first recess portions 46 penetrate through the first superlattice layer 23 and the heterojunction HJ, so that the bottom 46b is located in the supporting base 21, resulting in the reduction in the volume of the first superlattice layer 23 in the infrared light receiving device 10. The second recess portions 48 do not penetrate through the heterojunction HJ, thereby making it possible to connect the semiconductor mesas MS with each other therethrough. This interconnection between the semiconductor mesas MS forms a conduction path allowing the optical carriers to flow in the first superlattice layer 23.

As shown in FIG. 1, the semiconductor structure 20 is provided with the recess 44 which includes multiple first grooves 47 extending in the direction of the first axis Bx1, and multiple second grooves 49 extending in the direction of the second axis Bx2. The second axis Bx2 intersects the first axis Bx1, and in the present embodiment, the first and second axes Bx1 and Bx2 are oriented in the directions of X- and Y-axes, respectively. Each of the first grooves 47 has a depth that the first recess portions 46 each have, and each of the second grooves 49 has a depth that the second recess portions 48 each have. The first and second grooves 47 and 49 are arranged to form the array of the semiconductor mesas MS. The second grooves 49 are deeper than the second recess portions 48 at the intersection of the first and second grooves 47 and 49. As understood from the above description on the first and second recess portions 46 and 49, the first recess portions 46 and the first grooves 47 are deeper than the second recess portions 48 and the second grooves 49, respectively. The bottoms of the first and second grooves 47 and 49 are provided by those of the first and second recess portions 46 and 48, respectively.

In the infrared light receiving device 10, for example, the first grooves 47 each may have a bottom 46b in the supporting body 21, and extend beyond the first superlattice structure 23 and the hetero interface HJ. The first grooves 47 that penetrate through the first superlattice structure 23 can reduce the volume of the first superlattice structure 23 in the infrared light receiving device 10. The second grooves 49 that stop within the first superlattice structure 23 allows the remaining part of the first superlattice structure 23 to connect the arrayed semiconductor mesas MS to form propagating paths permitting photo-carriers to flow therethrough.

The infrared light receiving device 10 provides the semiconductor structure 20 with a contact structure 43 and a semiconductor wall 45. The contact structure 43 is disposed outside the array of semiconductor mesas MS, and the semiconductor wall 45 surrounds the array of semiconductor mesas MS. The contact structure 43 allows the first electrode 30 to make contact with the first superlattice layer 23 of the semiconductor laminate 22. In the embodiment, the first electrode 30 makes contact with the face of the first superlattice layer 23 at the contact opening 43a, and extends from the contact opening 43a along the outer side face of the semiconductor wall 45 to the top face of the semiconductor wall 45. The first electrode 30 on the top face of the semiconductor wall 45 is located at the substantially same level as that of the second electrode 32.

The semiconductor wall 45 defines the outer boundary of the recess 44 such that the recess does not extend outward, thereby making the recess 44 closed. The semiconductor wall 45 thus closed can prevent the contact opening 43a from being connected to the recess 44. During the etching in an exemplary method for fabricating the infrared light receiving device 10, forming the semiconductor wall 45 by etching can control the flow of etching gas to make processing accuracy of the width and depth of the recess 44 excellent. In the embodiment, the semiconductor wall 45 is defined by the recess 44 and the contact structure 43. Specifically, the closed semiconductor wall 45 has an inner face defined by the outermost grooves of the first and second grooves 47 and 49 of the recess 44, and an outer face defined by the contact opening 43a of the contact structure 43.

In the infrared light receiving device 10, the first superlattice layer 23 has multiple strips 26 in the semiconductor structure 20. Each of the strips 26 extends in the direction of the first axis Bx1 to connect, with each other, semiconductor mesas MS that are arranged therealong. The strip 26 has a width W26 substantially equal to or greater than the width of the semiconductor mesas MS. The strip 26 extends from a side of four boundaries of the array of semiconductor mesas MS to the opposite side, and is connected to an outer region of the first superlattice layer 23, which is disposed under the semiconductor wall 45 to reach the contact structure 43 and has a width larger than that of the strip 26. In an exemplary semiconductor structure 20, the first superlattice layer 23 is provided with the outer region, a part of which extends along the semiconductor wall 45 to form a closed-loop beneath the semiconductor wall 45, thereby encircling the array, and the first superlattice layer 23 bundles all the strips 26 at the closing part of the outer region. The arrangement of the strips 26 in the array enables both the reduction in volume of the first superlattice layer 23 and the connection of the arrayed semiconductor mesas MS with the first electrode 30 through the first superlattice layer 23. Reduction in both the size and pitch of the array of the semiconductor mesas MS for light receiving elements also makes the volume of the first superlattice layer 23 in the array small.

The infrared light receiving device 10 may further include an insulating film 82 that covers the semiconductor structure 20. Specifically, the insulating film 82 covers the arrayed semiconductor mesas MS, the contact structure 43, and the semiconductor wall 45, and has a first opening 82a on the first superlattice layer 23 and the contact opening 43a, and a second opening 82b on the top face of each semiconductor mesa MS. In the embodiment, the insulating film 82 can include a silicon-based inorganic insulator, such as silicon oxide, silicon nitride and silicon oxynitride.

Exemplary structure of the infrared light receiving device 10

Supporting base 21: n-type GaSb substrate with a thickness of 500 to 700 micrometers; and buffer layer 21b made of n-type GaSb with a thickness of 0.3 to 1 micrometers First superlattice layer 23: n-type GaSb/InAs superlattice layer (type-II) having a thickness of 1 to 5 micrometers Second superlattice layer 24: GaSb/InAs superlattice light absorbing layer (type-II) having a thickness of 1 to 4 micrometers Semiconductor region 25: p-type GaSb/InAs superlattice layer (type-II) having a thickness of 0.2 to 0.8 micrometers Semiconductor region 25: p-type GaSb contact layer with a thickness of 0.05 to 0.4 micrometers FIGS. 2A and 2B show respective cross sections of the first and second grooves 47 and 49. Referring to FIG. 2A, the first grooves 47 in the first recess portions 46 each have a shallow bottom 46c and a deep bottom 46d, which enable respective depths different from each other. The deep bottom 46d is located in the supporting base 21, and the bottom 46c is located in the first superlattice layer 23. The interval W46 between adjacent semiconductor mesas MS at the bottoms of the side faces thereof is larger than the width W46d of the deep bottom 46d. The infrared light receiving device 10 has an advantageous effect in the volume, reduced by the first and second grooves 47 and 49 that have respective depths different from each other, of the first superlattice layer 23. Referring to FIG. 2B, the second grooves 49 in the second recess portions 48 each have a bottom 48b, and the bottom 48b is substantially equal to the shallow bottom 46c and is located in the first superlattice layer 23.

FIGS. 3A and 3B show respective cross sections of the first and second grooves 47 and 49. Referring to FIG. 3A, the first grooves 47 in the first recess portions 46 each have a deep bottom 46d. The deep bottom 46d is located in the supporting base 21. The width W46d of the deep bottom 46d is defined as the distance between the adjacent semiconductor mesas MS at the lower edges of the side faces thereof. The infrared light receiving device 10 has an advantageous effect in the volume of the first superlattice layer 23 that is reduced using the first grooves 47, each of which has a deep bottom face 46b connecting to the side faces of the adjacent semiconductor mesas MS at both of the lower edges thereof. Referring to FIG. 3B, the second grooves 49 in the second recess portions 48 each have a shallow bottom face 48b connecting to the side faces of the adjacent semiconductor mesas MS at the lower edges of the side faces, and the bottom 48b has an width W48 defined as a distance between the side faces of the adjacent semiconductor mesas MS at the lower edges of the side faces thereof. The bottom 48b of the second groove 49 is located in the first superlattice layer 23.

Subsequently, a description will be given of a method for fabricating the infrared light receiving device 10 with reference to FIGS. 4A to 20B. To facilitate understanding, if possible, reference numerals which denote the infrared light receiving device 10 are used in the following description. The orthogonal coordinate system R is drawn in FIGS. 4A to 20B.

The method includes step S101 for processing the epitaxial substrate EP using chemical vapor deposition, photolithography and etching to form a recess (44), which defines an array (42) of semiconductor mesas (MS) for photodiodes, in the epitaxial substrate EP.

Figure 4B:
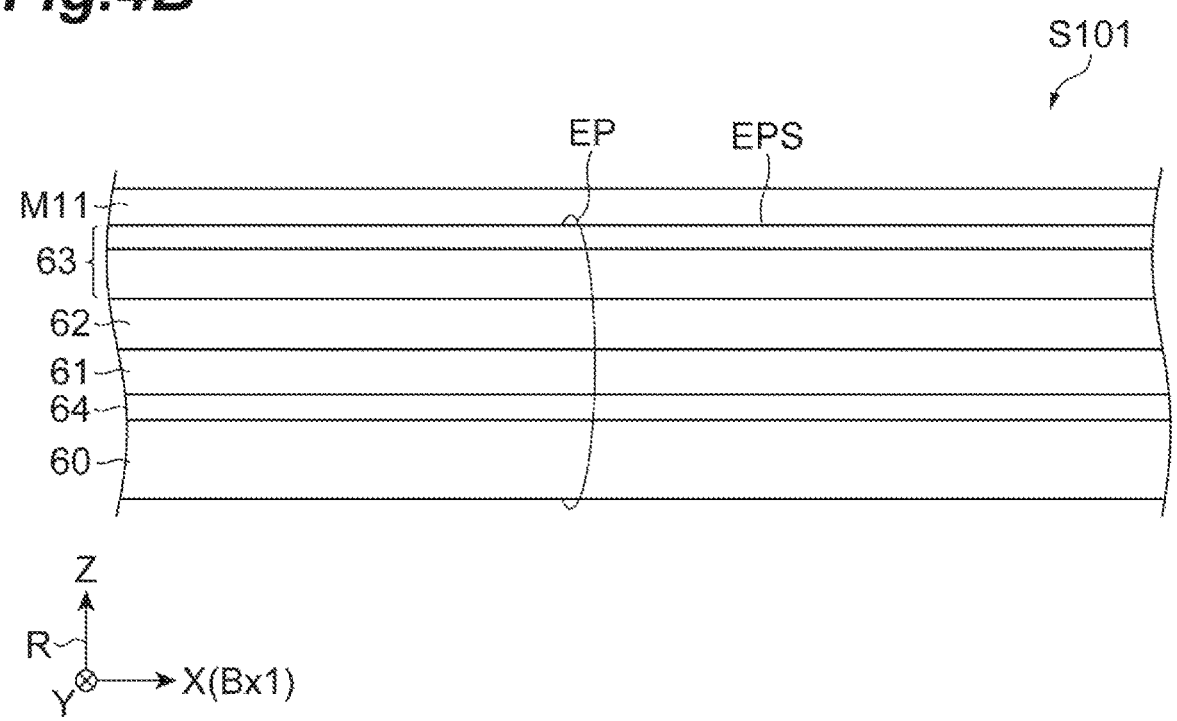
FIG. 4B is a schematic cross sectional view showing a major step in the method according to the embodiment.

In the embodiment, prior to the above process and mask formation, the epitaxial substrate EP is prepared. Referring to FIGS. 4A and 4B, the epitaxial substrate EP includes a semiconductor laminate body SP and a semiconductor substrate 60, and semiconductor substrate 60 mounts the semiconductor laminate body SP. The semiconductor laminate body SP includes a first semiconductor layer 61 for the first superlattice layer 23, a second semiconductor layer 62 for the second superlattice layer 24, and a third semiconductor layer 63 for the semiconductor region 25.

A description will be given of preparing the epitaxial substrate EP below. Specifically, the step for preparing the epitaxial substrate EP begins with preparing a semiconductor substrate 60 for crystal growth, and includes epitaxially growing a semiconductor laminate body SP on the semiconductor substrate 60. This growth includes, for example, metal-organic vapor phase epitaxy and/or molecular beam epitaxy. The semiconductor laminate body SP may include a semiconductor layer 64 for the buffer layer 21b, and if needed, the semiconductor layer 64 is grown on the semiconductor substrate 60. The semiconductor laminate body SP includes a first semiconductor layer 61, a second semiconductor layer 62, and a third semiconductor layer 63, which are formed on the principal face of the semiconductor substrate 60, specifically, on the semiconductor layer 64.

Exemplary epitaxial substrate EP

Semiconductor substrate 60: n-type GaSb substrate

First semiconductor layer 61: n-type GaSb/InAs superlattice layer

Second semiconductor layer 62: GaSb/InAs superlattice light absorbing layer

Third semiconductor layer 63: p-type GaSb/InAs superlattice layer and p-type GaSb contact layer With reference to FIGS. 4A to 13B, a description will be given of the method for fabricating an infrared light receiving device of the structure shown in FIGS. 2A and 2B. The cross-sections that will be referred to in the description of the subsequent process steps are associated with the respective cross-sections of the infrared light receiving device 10 shown in FIGS. 2A and 2B.

Figure 5:
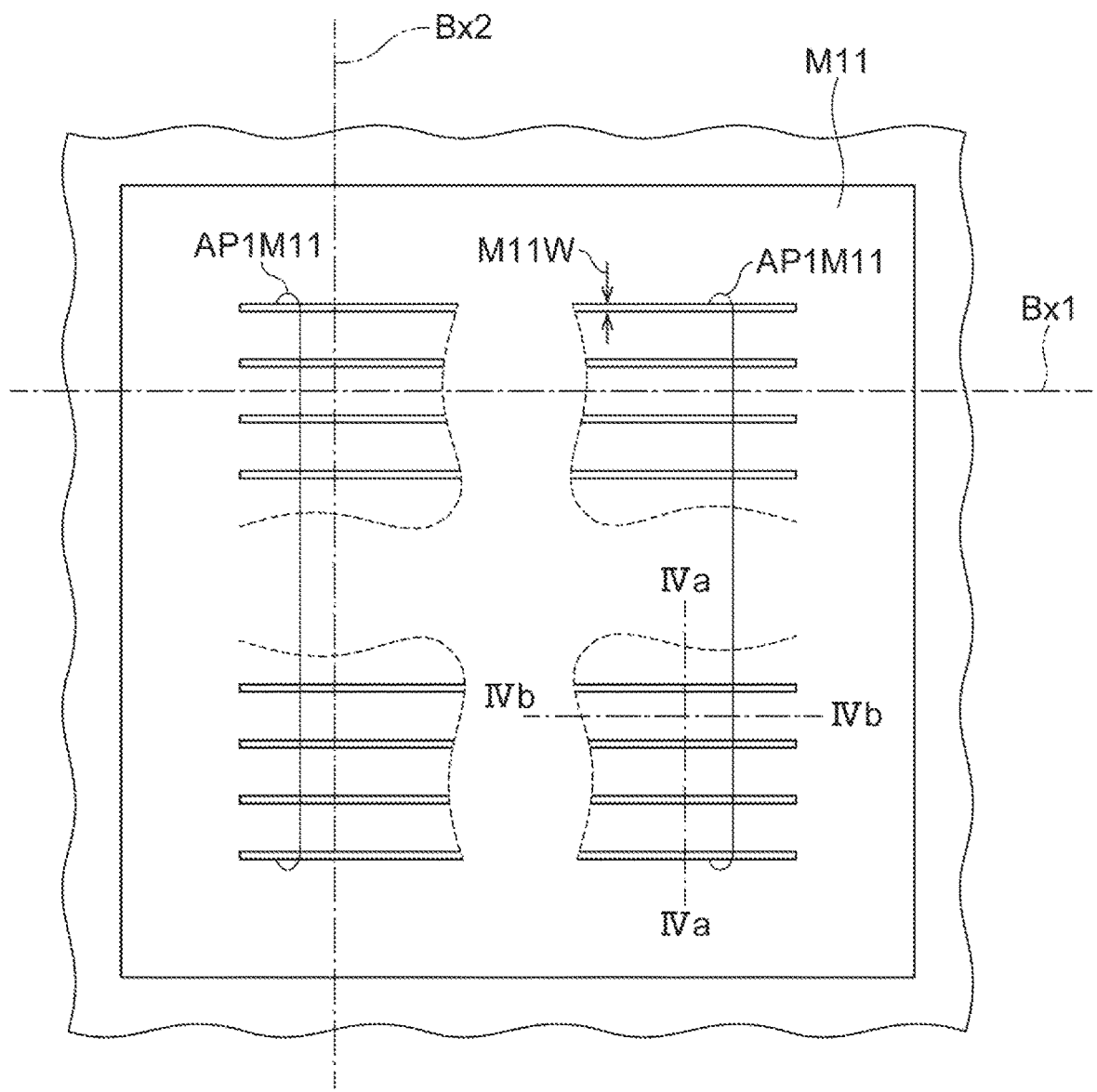
FIG. 5 is a schematic plan view showing a first mask and an epitaxial substrate in the method according to the embodiment.

An insulating film made of, for example, a silicon-based inorganic insulating material for the first mask M11 is deposited on the principal face EPS of the epitaxial substrate EP thus prepared, and can be formed, for example, by chemical vapor deposition (CVD). The insulating film is processed by photolithography and etching to form a first mask M11. FIG. 5 shows a first mask M11 and an epitaxial substrate. FIGS. 4A and 4B show cross sections, taken along lines IVa-IVa and IVb-IVb in FIG. 5, respectively.

Specifically, the first mask M11 is formed on the principal surface EPS of the epitaxial substrate EP. The first mask M11 has multiple first openings AP1M11. The first openings AP1M11 are arranged in one of the directions of the first and second axes Bx1 and Bx2 and extend in the other direction and, for example, extend in the direction of the first axis Bx1 and arranged along the direction of the second axis Bx2. This process brings, to the infrared light receiving device 10, the recess with branches extending in the first and second axes Bx1 and Bx2. In the embodiment, the first mask M11 includes, for example, a silicon-based inorganic insulator.

Width M11W of the first openings AP1M11: 0.5 to 5 micrometers

The first openings AP1M11 define the location of the first grooves 47, which will be formed in the next step so as to has deep bottoms shown in FIG. 2A.

Figure 6A:
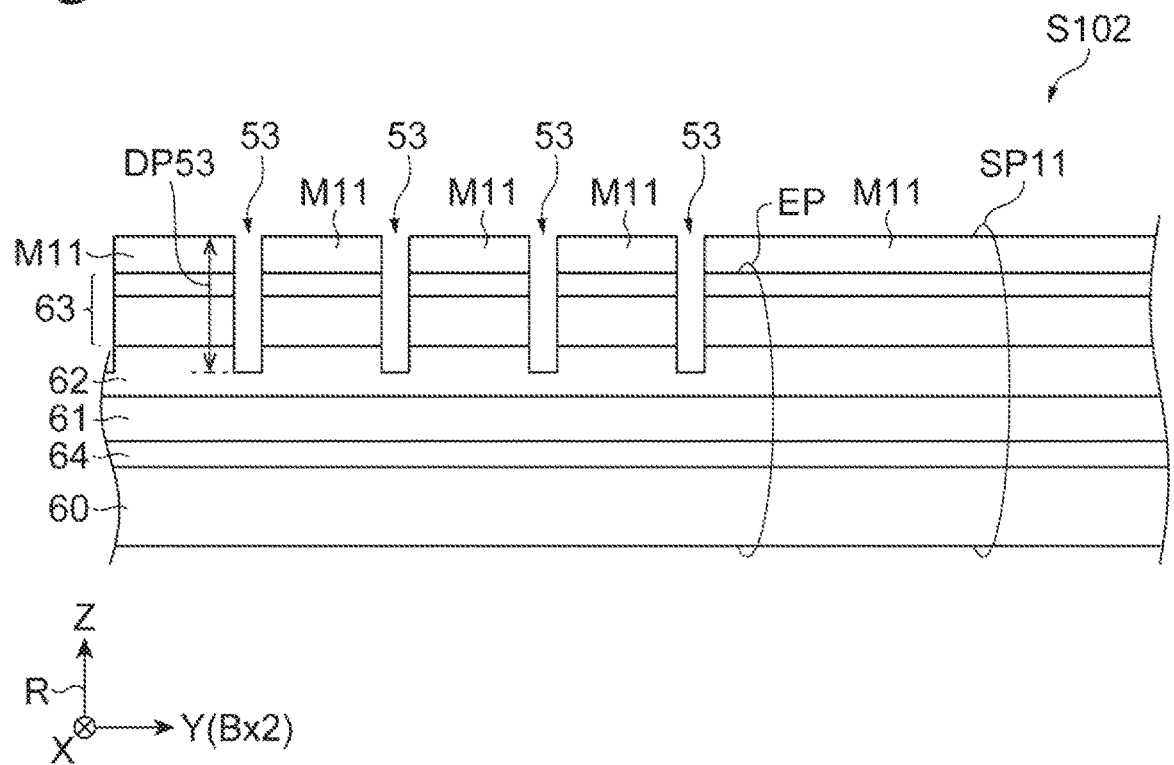
FIG. 6A is a schematic cross sectional view showing a major step in the method according to the embodiment.
Figure 6B:
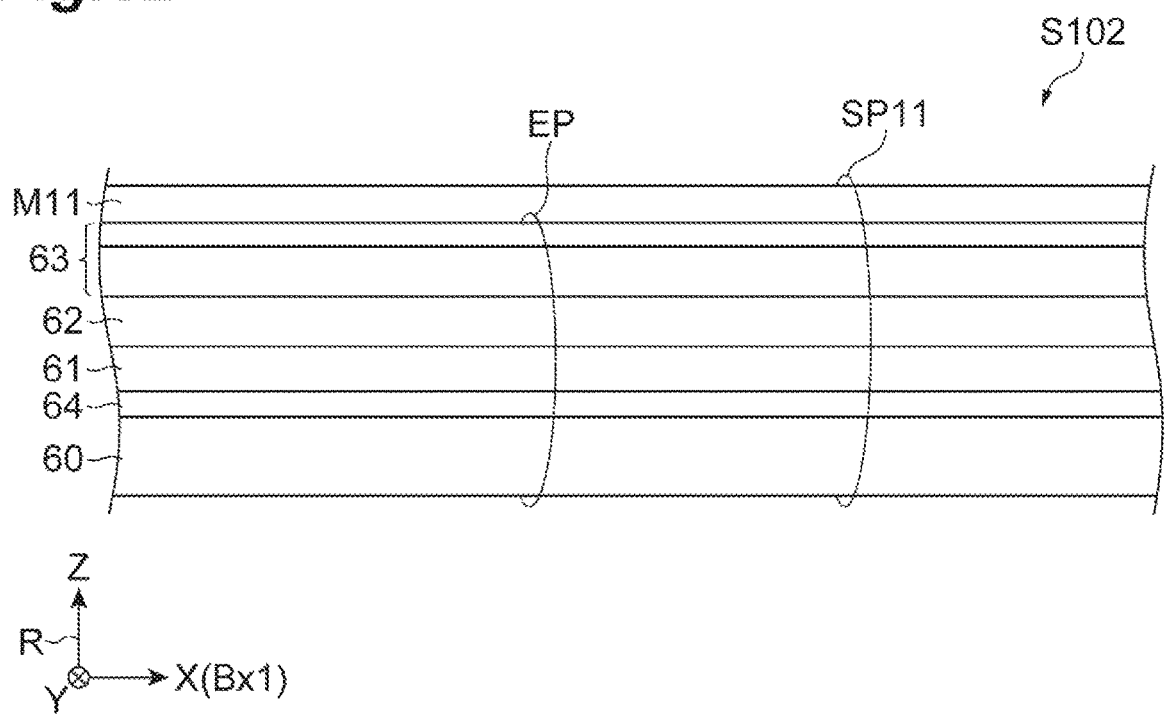
FIG. 6B is a schematic cross sectional view showing a major step in the method according to the embodiment.

In step S102, as shown in FIGS. 6A and 6B, the epitaxial substrate EP is etched with the first mask M11 to produce a first substrate product SP11. FIGS. 6A and 6B show the progress of the respective cross sections shown in FIGS. 4A and 4B. As shown in FIG. 6A, the etching produces third recess portions 53 in the epitaxial substrate EP, and is stopped in the middle of the second semiconductor layer 62. The third recess portions 53 are associated with the first grooves 47, each of which has bottoms (the deep bottom 46*d* and the shallow bottom 46*c*) having depths different from each other as shown in FIGS. 2A and 2B. In the embodiment, the first mask M11 is not removed after the etching and is left thereon. The etching gas includes, for example, halogen gas.

Depth DP53 of the third recess portions 53: 1.2 to 4 micrometers

Depth of the third recess portions 53 is associated with the difference between the deep bottom and the shallow bottom of the first grooves 47 shown in FIG. 2A.

Figure 7:
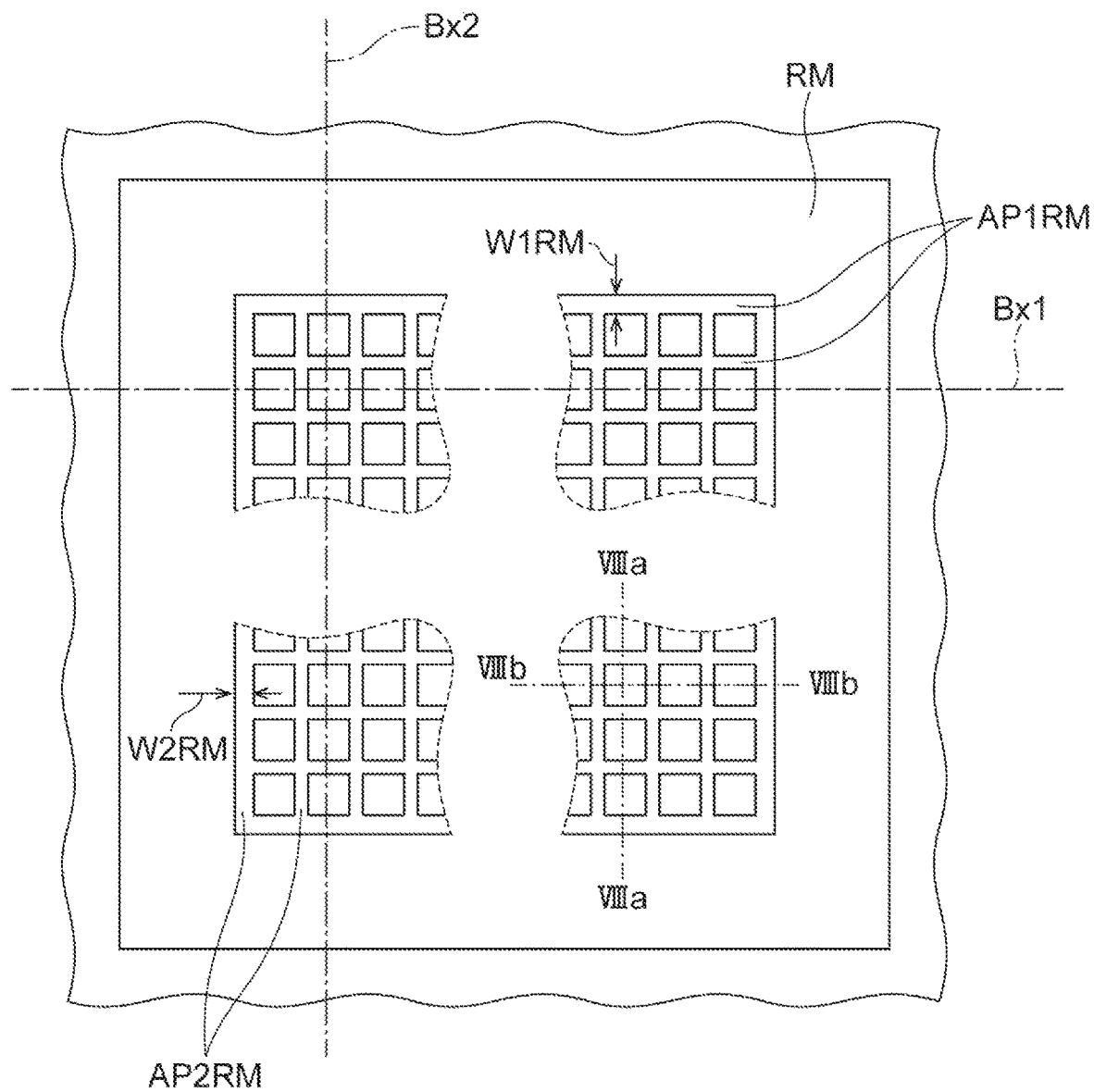
FIG. 7 is a schematic plan view showing a pattern of the second mask in a process in the method according to the embodiment.
Figure 8A:
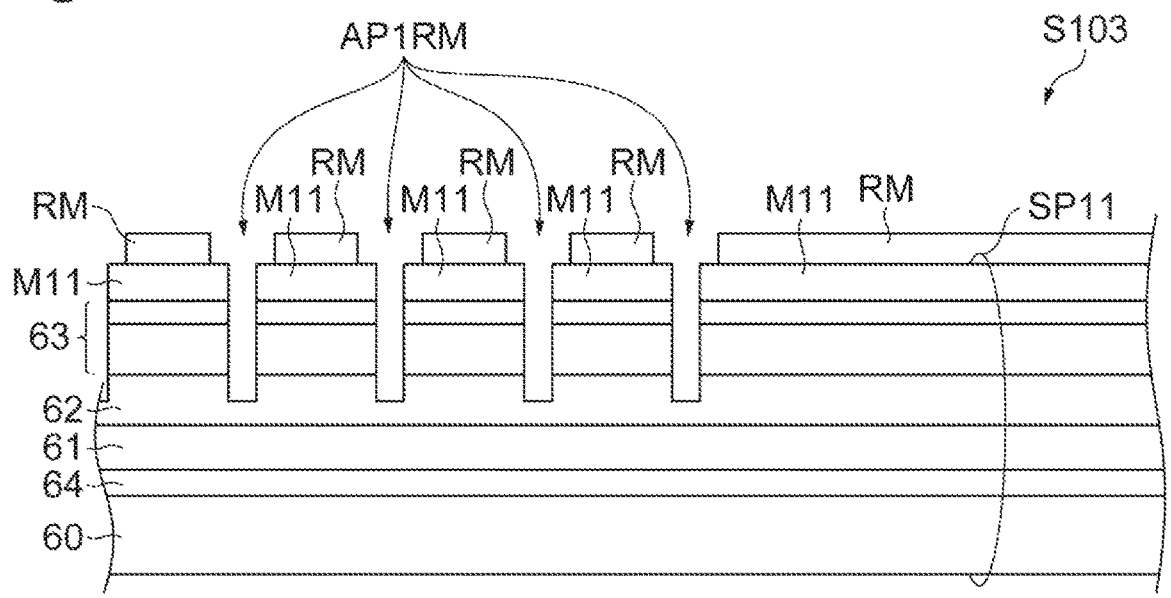
FIG. 8A is a schematic cross sectional view showing a major step in the method according to the present embodiment.
Figure 8B:
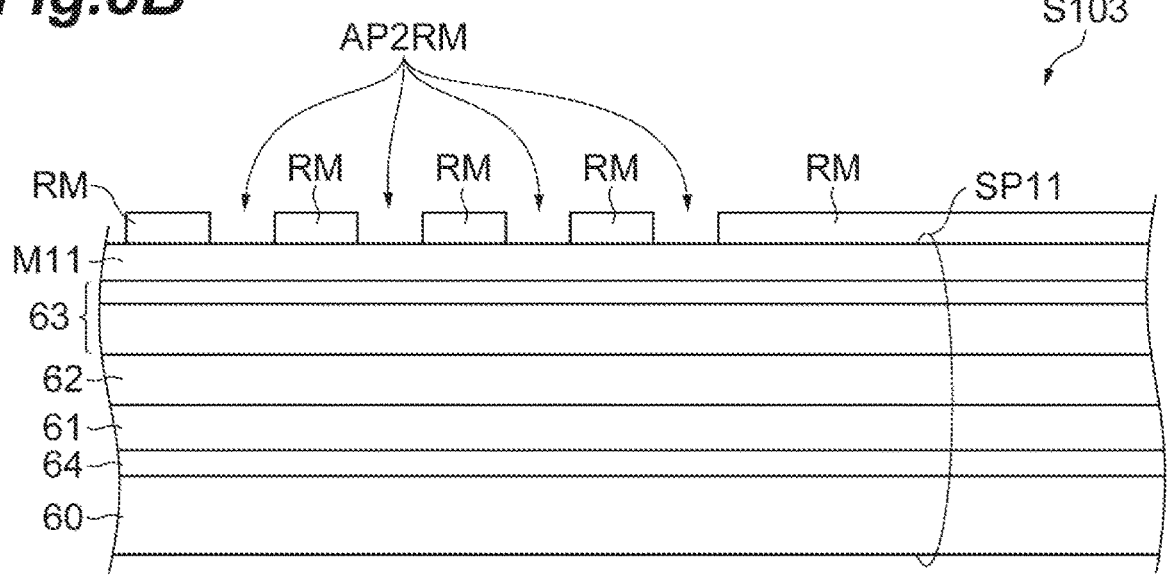
FIG. 8B is a schematic cross sectional view showing a major step in the method according to the present embodiment.

In step S103, as shown in FIGS. 7, 8A and 8B, an etching mask RM is formed on the first substrate product SP11. FIG. 7 is a plan view illustrating a pattern of an etching mask RM and an epitaxial substrate EP in the method according to the embodiment. FIG. 8A is a schematic cross sectional view, taken along line VIIIa-VIIIa shown in FIG. 7, and FIG. 8B is a schematic cross sectional view taken along line VIIIb-VIIIb shown in FIG. 7. FIGS. 8A and 8B show the progress of the respective cross sections shown in FIGS. 6A and 6B. The etching mask RM may be made of, for example, resist, and is formed on the first mask M11 by photolithography.

As shown in FIG. 7, the etching mask RM has first openings AP1RM and second openings AP2RM. In the embodiment, the first openings AP1RM extend in the direction of the first axis Bx1, and the second openings AP2RM extend in the direction of the second axis Bx2. The etching mask RM is aligned with the third recess portions 53 such that the first openings AP1RM of the etching mask RM is positioned to the third recess portions 53, so that both the entire third recess portions 53 and the first mask M11 as underlying layers appear at the first openings AP1RM. The underlying first mask M11 appears in the second openings A2PM11. The first openings AP1RM define the location of the first grooves 47 shown in FIG. 2A and the second openings AP2RM define the location of the second grooves 49 shown in FIG. 2B.

Etching mask RM: resist

Width W1RM of the first openings APRM: 3 to 10 micrometers

Width W2RM of the second openings AP2RM: 3 to 10 micrometers

Figure 9A:
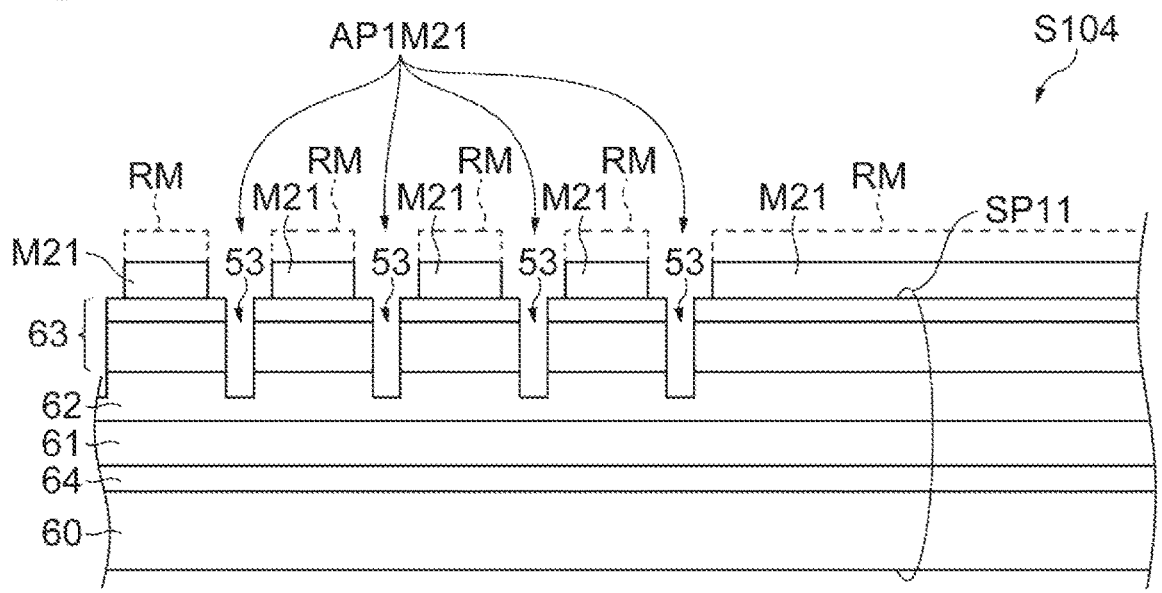
FIG. 9A is a schematic cross sectional view showing a major step in the method according to the embodiment.
Figure 9B:
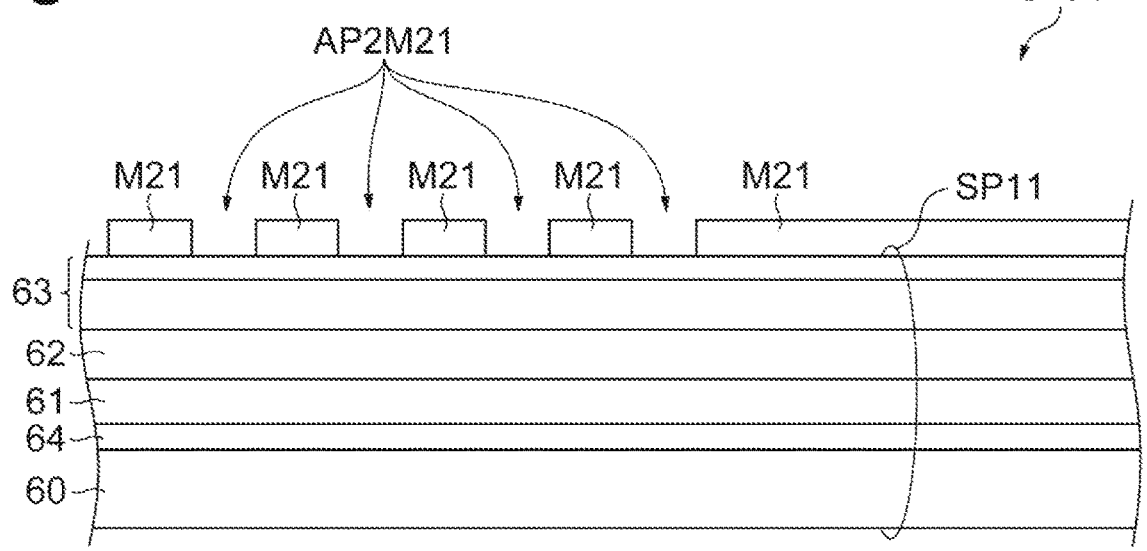
FIG. 9B is a schematic cross sectional view showing a major step in the method according to the embodiment.

In step S104, as shown in FIGS. 9A and 9B, the first mask M11 is etched with the etching mask RM to produce a second mask M21 from the first mask M11, and then the etching mask RM is removed. In the embodiment, the second mask M21 includes the same material as the first mask M11, for example, a silicon-based inorganic insulator. FIGS. 9A and 9B show the progress of the respective cross sections shown in FIGS. 8A and 8B.

The second mask M21 has a pattern, and is formed by an etching process, which transfers the pattern of the etching mask RM to the first mask M11. The second mask M21 has substantially the same pattern as that of the etching mask RM shown in FIG. 7, and specifically, is provided with both the first openings AP1M21 (produced from the first openings AP1RM by transferring) and the second opening AP2M21 (produced from the second openings AP2RM by transferring). In the second mask M21 according to the embodiment, the first openings AP1M 21 extend in the direction of the first axis Bx1, and the second openings AP2M21 extend in the direction of the second axis Bx2. The above process makes the second mask M21 aligned with the third recess portions 53, such that the first openings AP1M21 are located on the third recess portions 53. The entire third recess portions 53 and the underlying first mask M11 appear at the first openings AP1M21, and the underlying first mask M11 appears in the second opening AP2M21. The first openings AP1M21 of the second mask M21 defines the location of the first grooves 47 shown in FIG. 2A, and the second openings AP2M21 of the second mask M21 defines the location of the second grooves 49 shown in FIG. 2B.

Figure 10A:
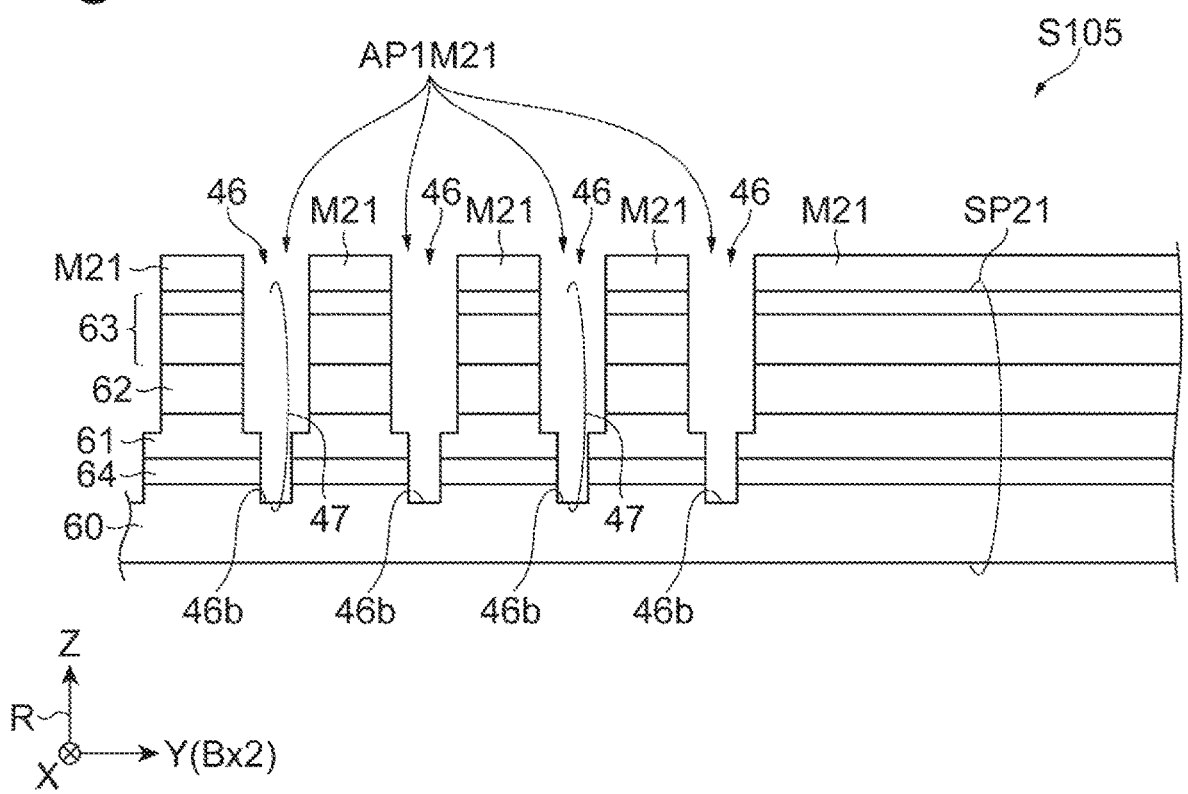
FIG. 10A is a schematic cross sectional view showing a major step in the method according to the embodiment.
Figure 10B:
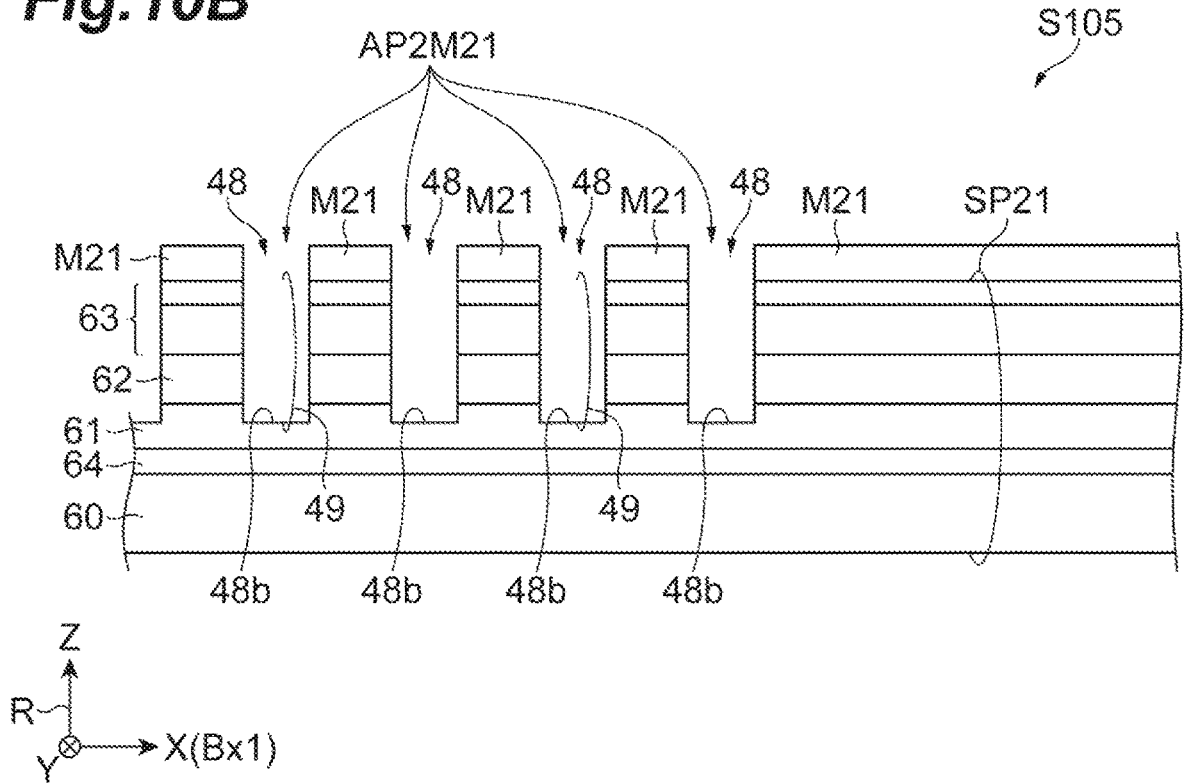
FIG. 10B is a schematic cross sectional view showing a major step in the method according to the embodiment.

In step S105, as shown in FIGS. 10A and 10B, the first substrate product SP11 is etched with the second mask M21 in order to form a second substrate product SP21. Specifically, this etching produces the first and second recess portions 46 and 48 at the first and second openings AP1M 21 and AP2M21 of the second mask M21, respectively. FIGS. 10A and 10B show the progress of the respective cross sections shown in FIGS. 9A and 9B. As shown in FIGS. 10A and 10B, the etching is stopped so as to form the bottom 46*b* of the first recess portions 46 in the semiconductor substrate 60, so that the first and second grooves 47 and 49 are formed using the second mask M21 at the first and second openings AP1M21 and AP2M21 and extend in the directions of the first and second axes Bx1 and Bx2, respectively. After the etching, the second mask M21 is removed to obtain the second substrate product SP21.

The above steps bring the recess of the infrared light receiving device shown in FIGS. 2A and 2B to completion. Specifically, the first and second recess portions 46 and 48 are formed in the first substrate product SP11 by forming the second mask M21 and then processing the first substrate product SP11 with the second mask M21.

Figure 11A:
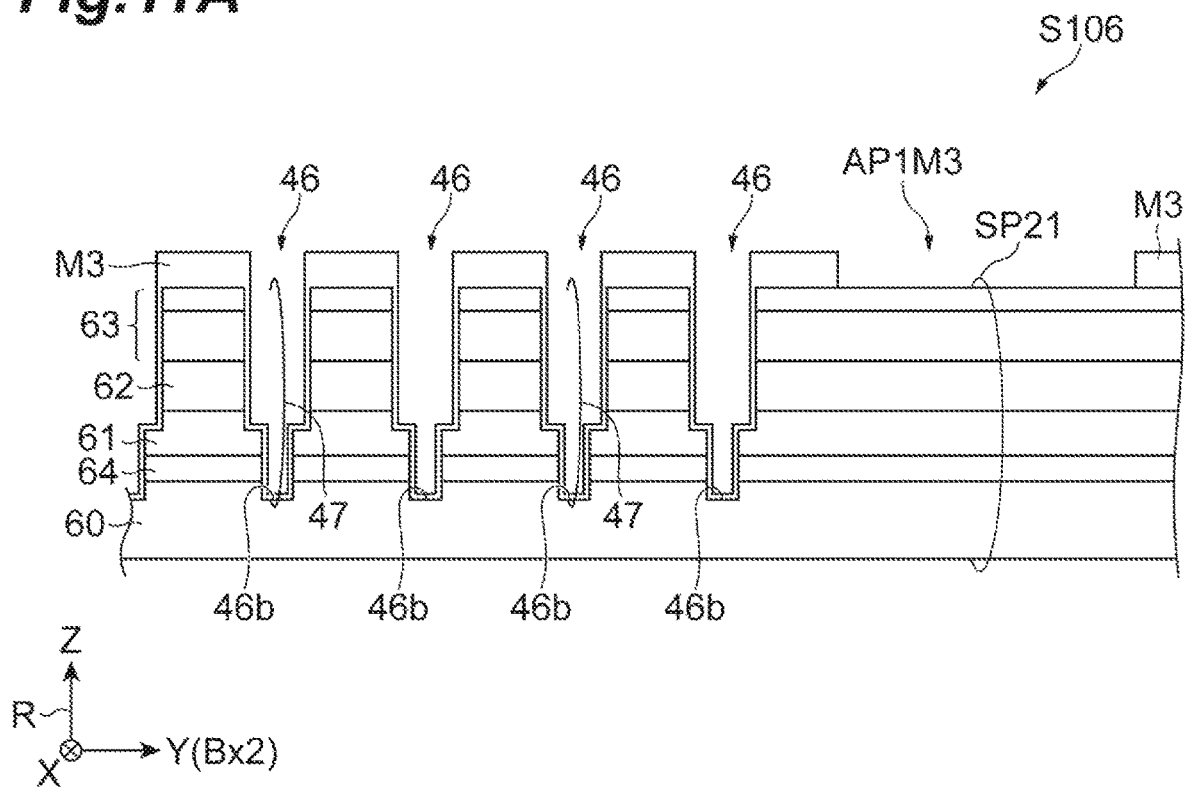
FIG. 11A is a schematic cross sectional view showing a major step in the method according to the embodiment.
Figure 11B:
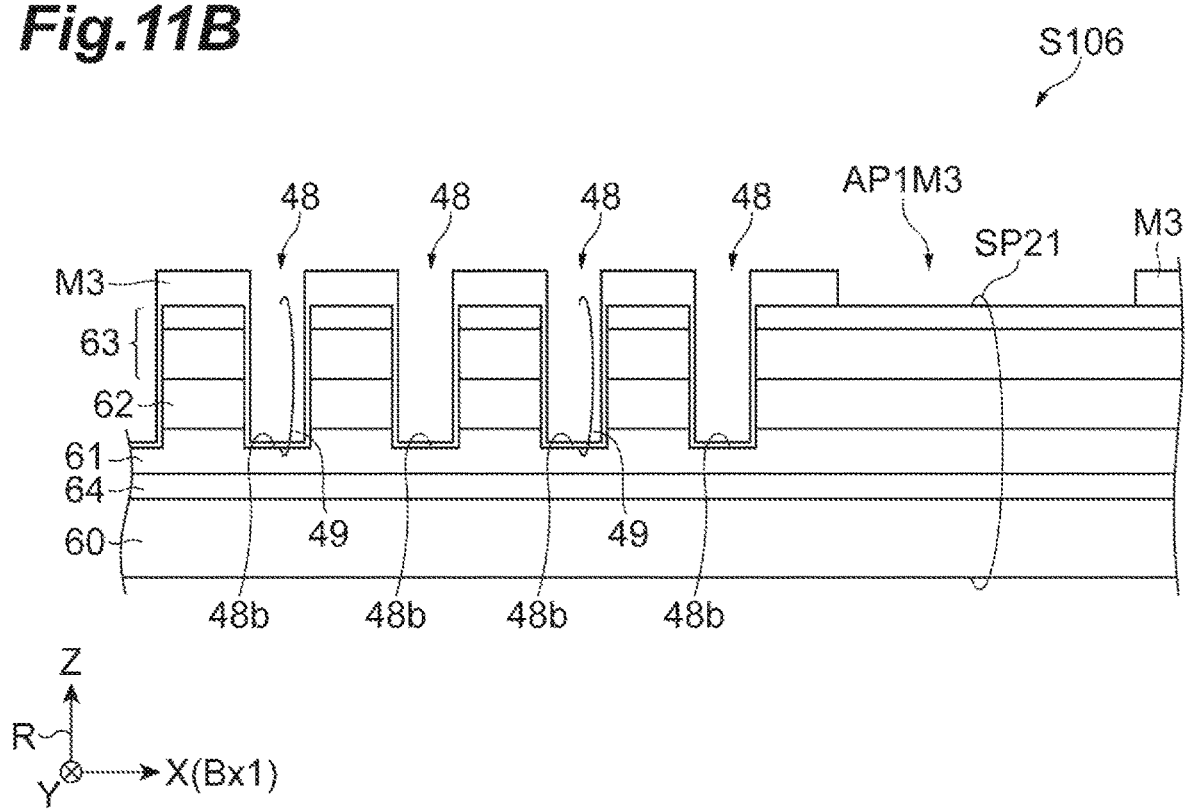
FIG. 11B is a schematic cross sectional view showing a major step in the method according to the embodiment.

In step S106, as shown in FIGS. 11A and 11B, a third mask M3 is formed on the second substrate product SP21, and defines a groove encircling the array of semiconductor mesas MS. FIGS. 11A and 11B show the progress of the respective cross sections shown in FIGS. 11A and 11B. Referring FIG. 1 and FIGS. 2A and 2B, the infrared light receiving device is provided with the contact structure 43 in the peripheral region that encircles the array of semiconductor mesas MS. The contact opening 43a of the contact structure 43 is defined by the pattern of the third mask M3, which is used to process the semiconductor laminate body SP of the second substrate product SP21. Specifically, the third mask M3 has an opening AP1M3, and the opening AP1M3 is disposed outside the array of the first and second grooves 47 and 49, and in the embodiment, the third mask M3 has a closed-strip shape.

Figure 12A:
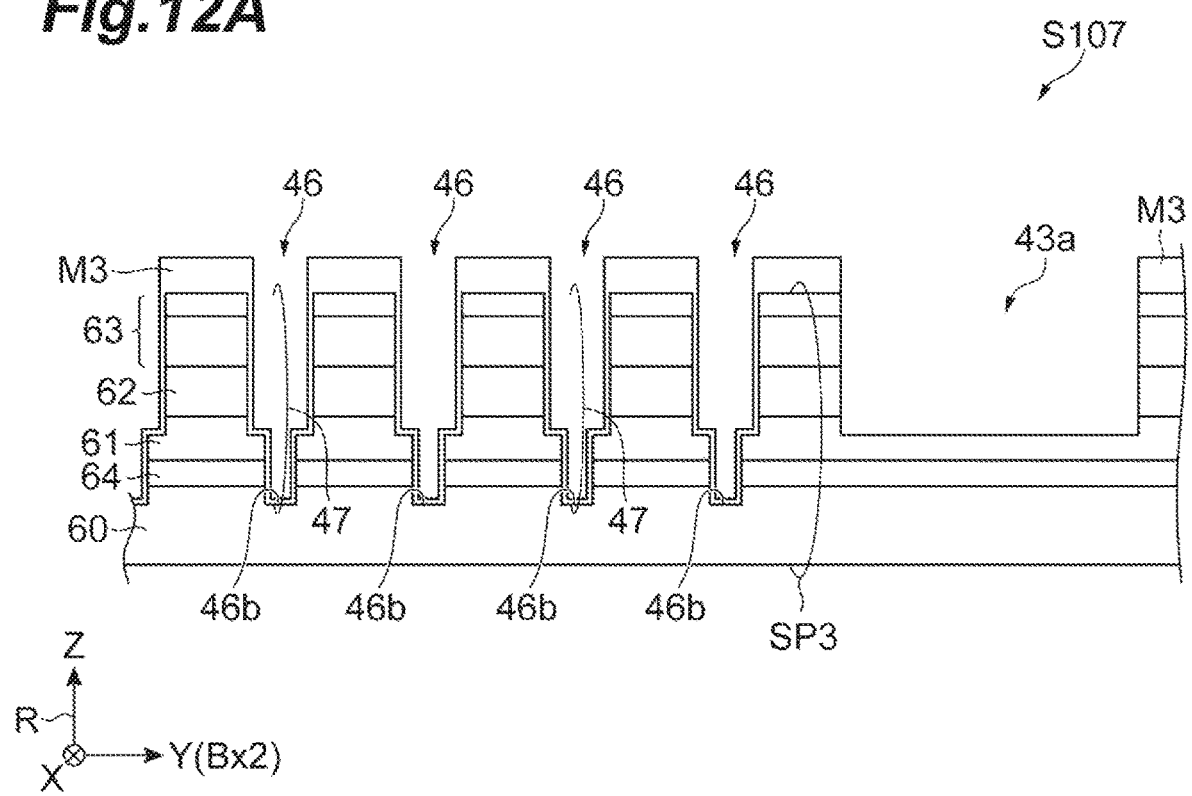
FIG. 12A is a schematic cross sectional view showing a major step in the method according to the embodiment.
Figure 12B:
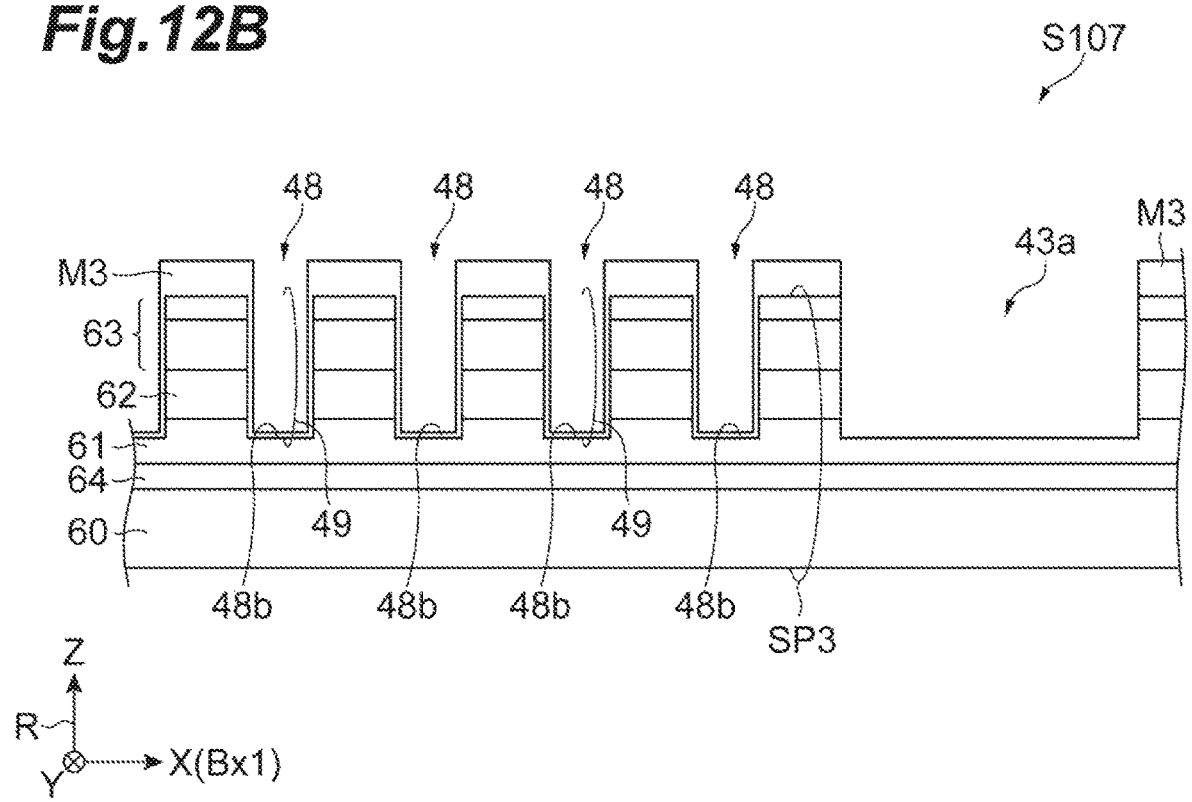
FIG. 12B is a schematic cross sectional view showing a major step in the method according to the embodiment.

In step S107, as shown in FIGS. 12A and 12B, the second substrate product SP21 is etched with the third mask M3 to form a contact structure, which will be used to connect the first electrode 30 to the first superlattice layer 43. The contact structure 43 provides the contact opening 43a with a depth to the first semiconductor layer 61 for the first superlattice layer. FIGS. 12A and 12B show the progress of the respective cross sections shown in FIGS. 11A and 11B. After the etching, the third mask M3 is removed to form a third substrate product SP3.

Figure 13A:
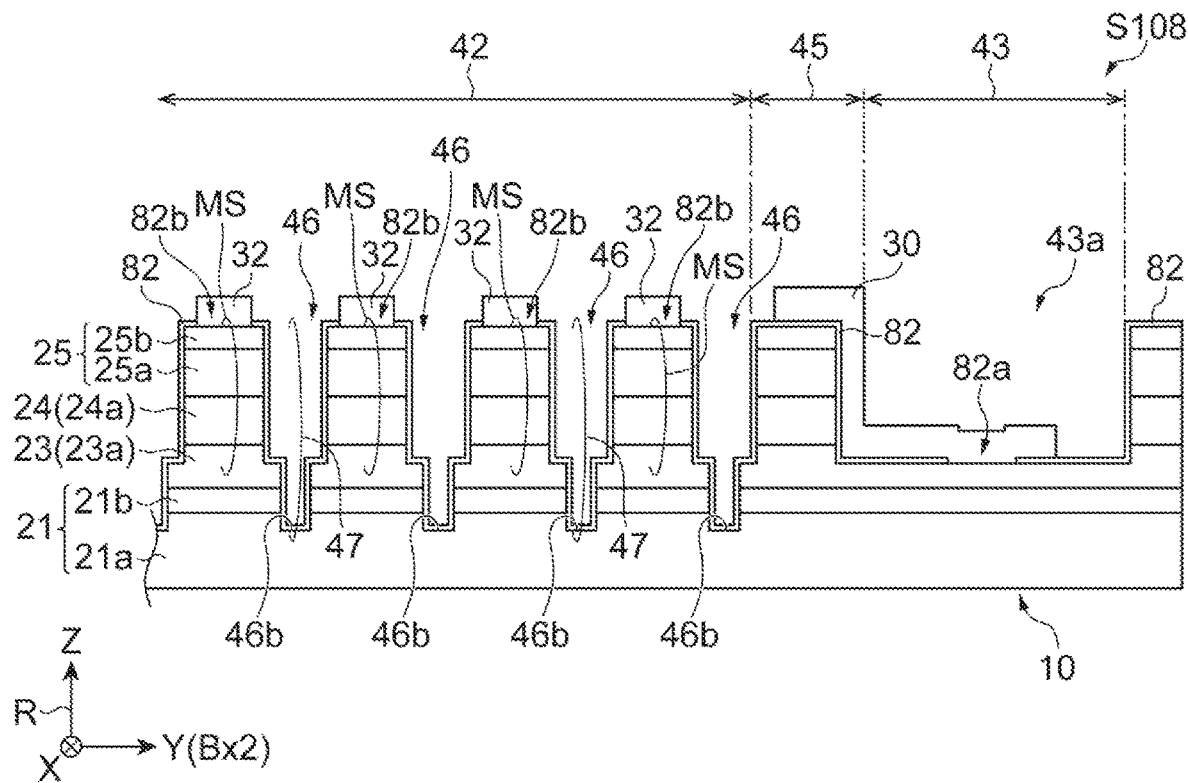
FIG. 13A is a schematic cross sectional view showing a major step in the method according to the embodiment.
Figure 13B:
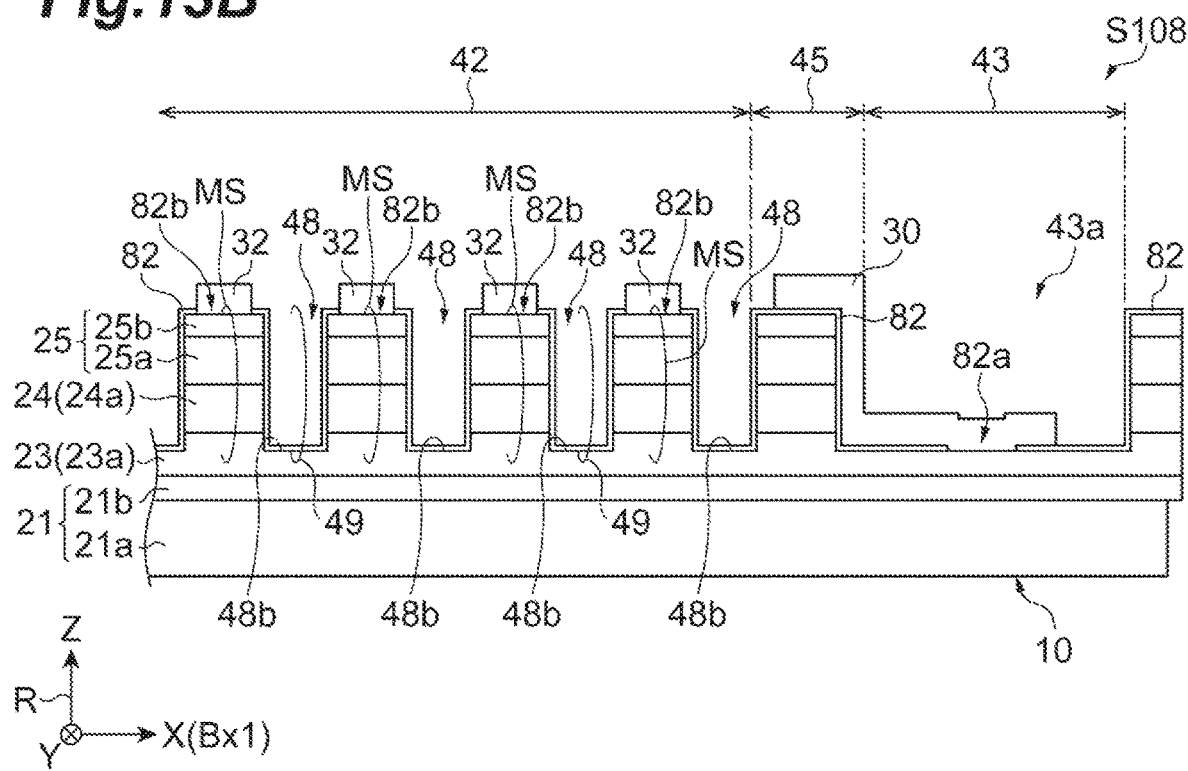
FIG. 13B is a schematic cross sectional view showing a major step in the method according to the embodiment.

In step S108, as shown in FIGS. 13A and 13B, the anode electrode and the cathode electrode are formed on the third substrate product SP3. FIGS. 13A and 13B show the progress of the respective cross sections shown in FIGS. 12A and 12B. In the embodiment, prior to the formation of these electrodes, an insulating film 82 is formed on the third substrate product SP3 and has a first opening 82a and a second opening 82b. The first and second openings 82a and 82b are located on the contact opening 43a of the contact structure 43 and the top face of each of the semiconductor mesas MS, respectively. The insulating film 82 is deposited by vapor deposition. After forming the insulating film 82, the first electrode 30 is formed in contact with the first superlattice layer of the contact structure 43, and the second electrode 32 is formed in contact with the top face of the semiconductor mesa MS. Each of the first and second electrodes 30 and 32 is formed by lift-off, specifically through the formation of a lift-off mask, deposition of a metal film and removal of the lift-off mask. These steps bring the infrared light receiving device shown in FIGS. 2A and 2B to completion.

With reference to FIGS. 14 to 20B, a description will be given of the method for fabricating the infrared light receiving device shown in FIGS. 3A and 3B. To facilitate understanding, if possible, reference numerals which are used in the forgoing description of the infrared light receiving device 10 will be used in the following description.

The following steps follow the step for preparing the epitaxial substrate EP.

Figure 14:
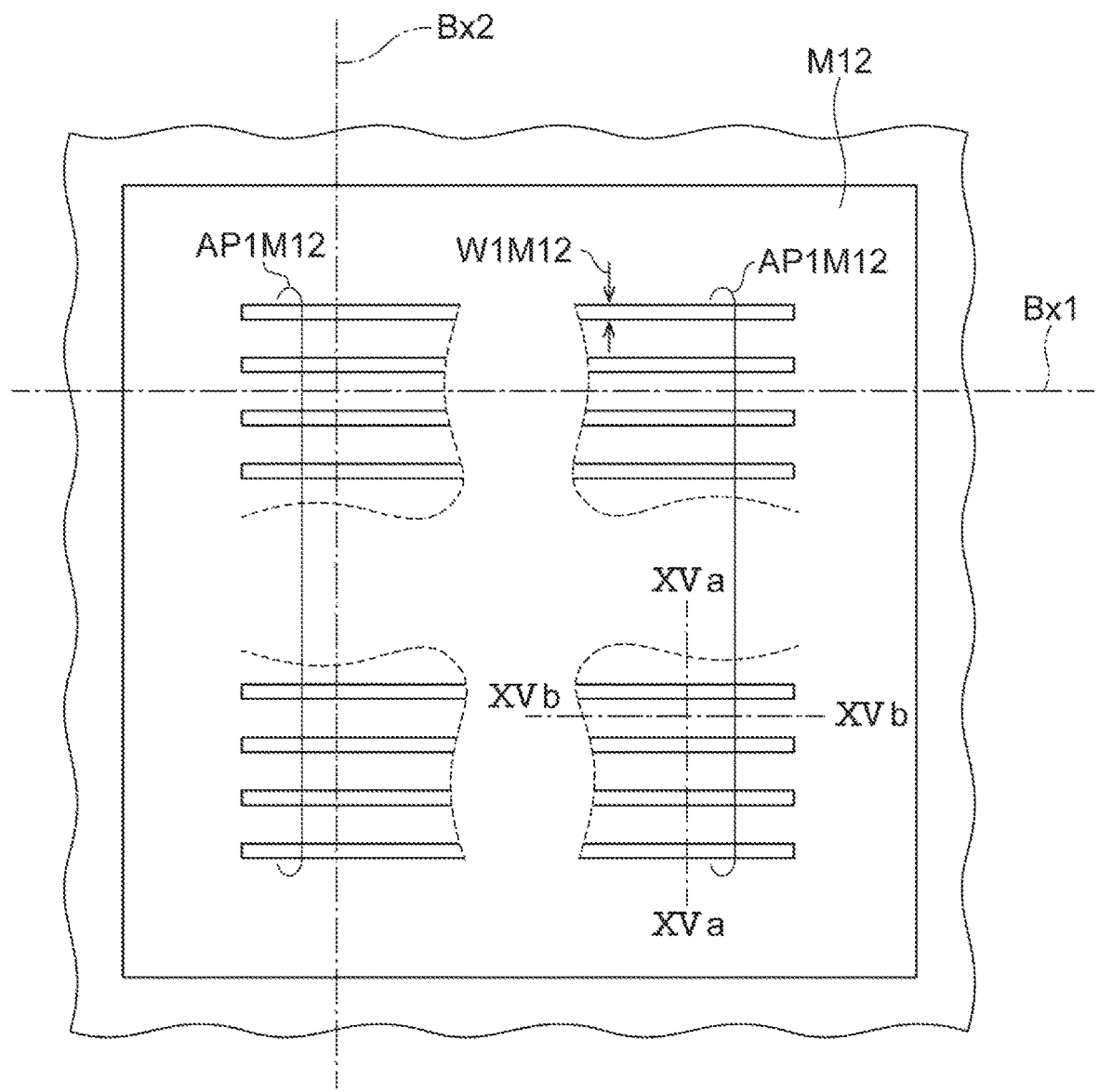
FIG. 14 is a schematic plan view showing a pattern of the first mask in a process of the method according to the embodiment.
Figure 15A:
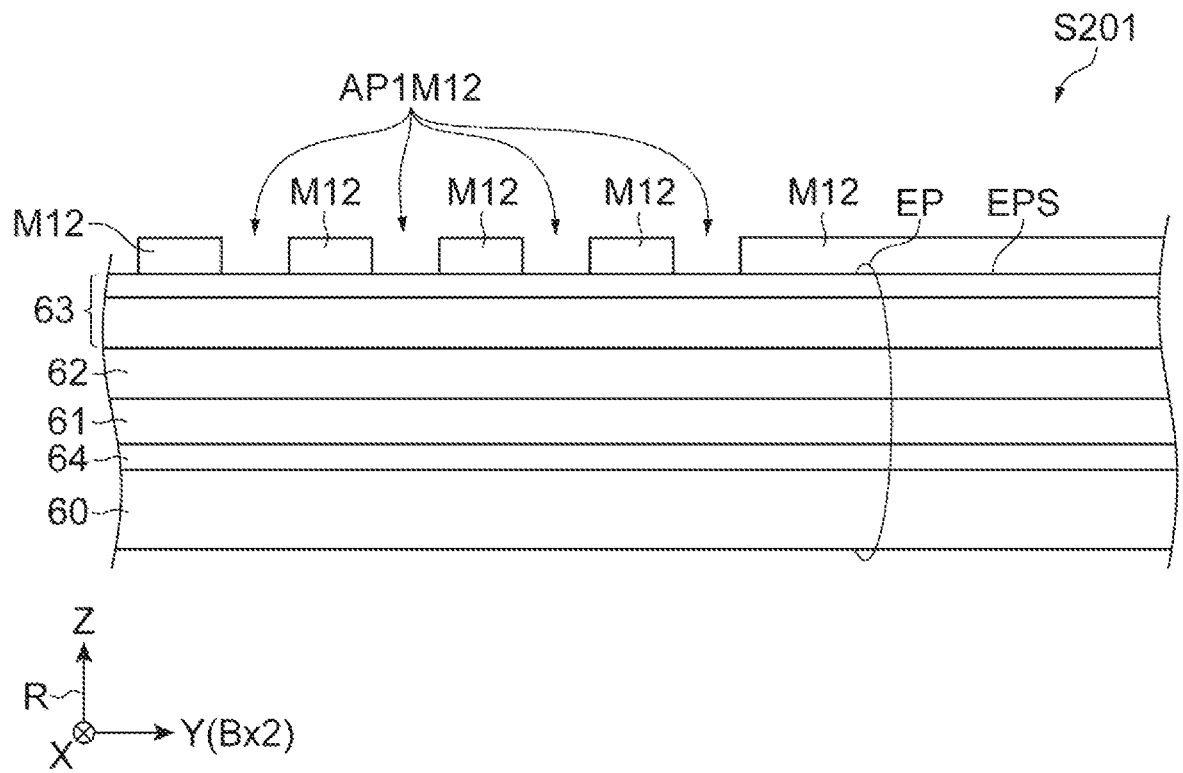
FIG. 15A is a schematic cross sectional view showing a major step in the method according to the embodiment.
Figure 15B:
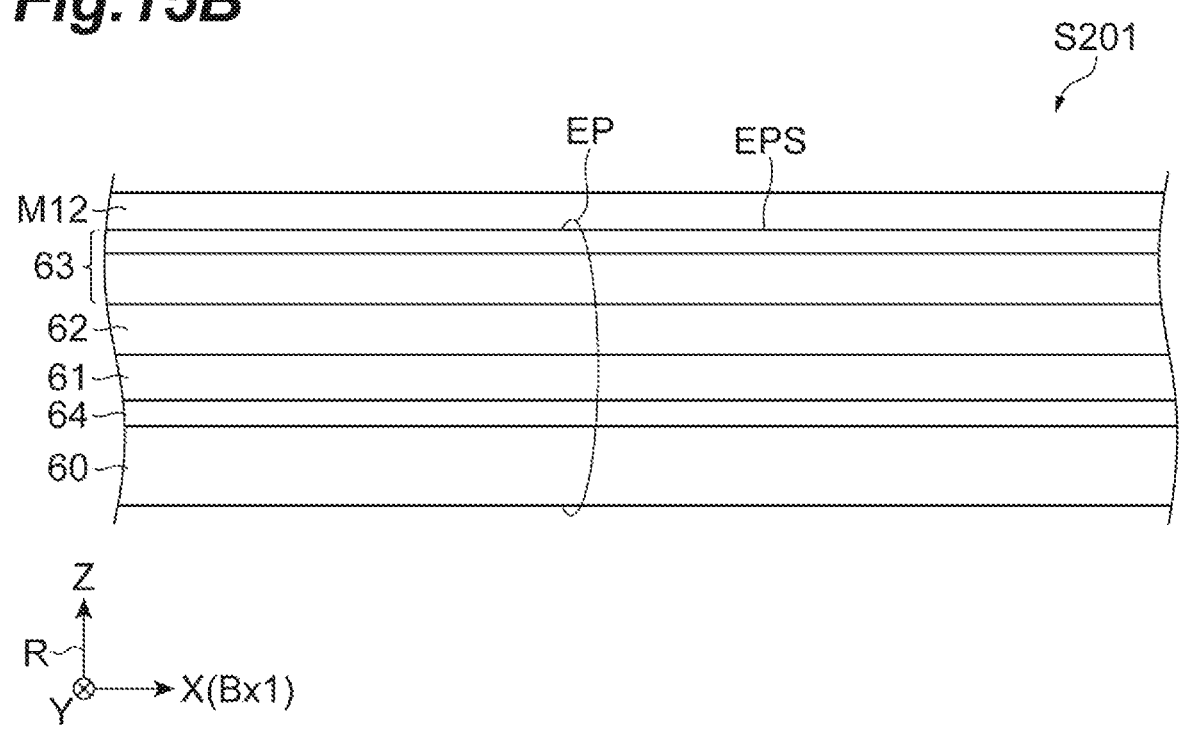
FIG. 15B is a schematic cross sectional view showing a major step in the method according to the embodiment.

In step S201, as shown in FIGS. 14, 15A and 15B, a first mask M12 is formed on the principal face EPS of the epitaxial substrate EP. FIG. 14 illustrates a pattern of the first mask M12 in the process steps for fabricating another infrared light receiving device according to the embodiment. FIG. 15A is a schematic cross sectional view taken along line XVa-XVa shown in FIG. 14, and FIG. 15B is a schematic cross sectional view taken along line XVb-XVb shown in FIG. 14. The cross-sections that will be referred to in the description of the subsequent process steps are associated with the respective cross-sections of the infrared light receiving device 10 shown in FIGS. 3A and 3B.

A first mask M12 is formed on the principal surface EPS of the epitaxial substrate EP, and has a pattern defining one of the first and second grooves 47 and 49, for example, the first grooves 47 in the embodiment. The first mask M12 has multiple first openings AP1M12 that define the location of the first recess portions 46. The first openings AP1M12 extend in the direction of the first axis Bx1, and are arranged along the direction of the second axis Bx2. The first openings AP1M12 defines the first grooves of the recess 44, which defines the arrayed semiconductor mesas MS for photodiodes.

Width W1M12 of the first openings AP1M12: 0.5 to 5 micrometers

The first mask M12 may include, for example, silicon-based inorganic insulator.

Figure 16A:
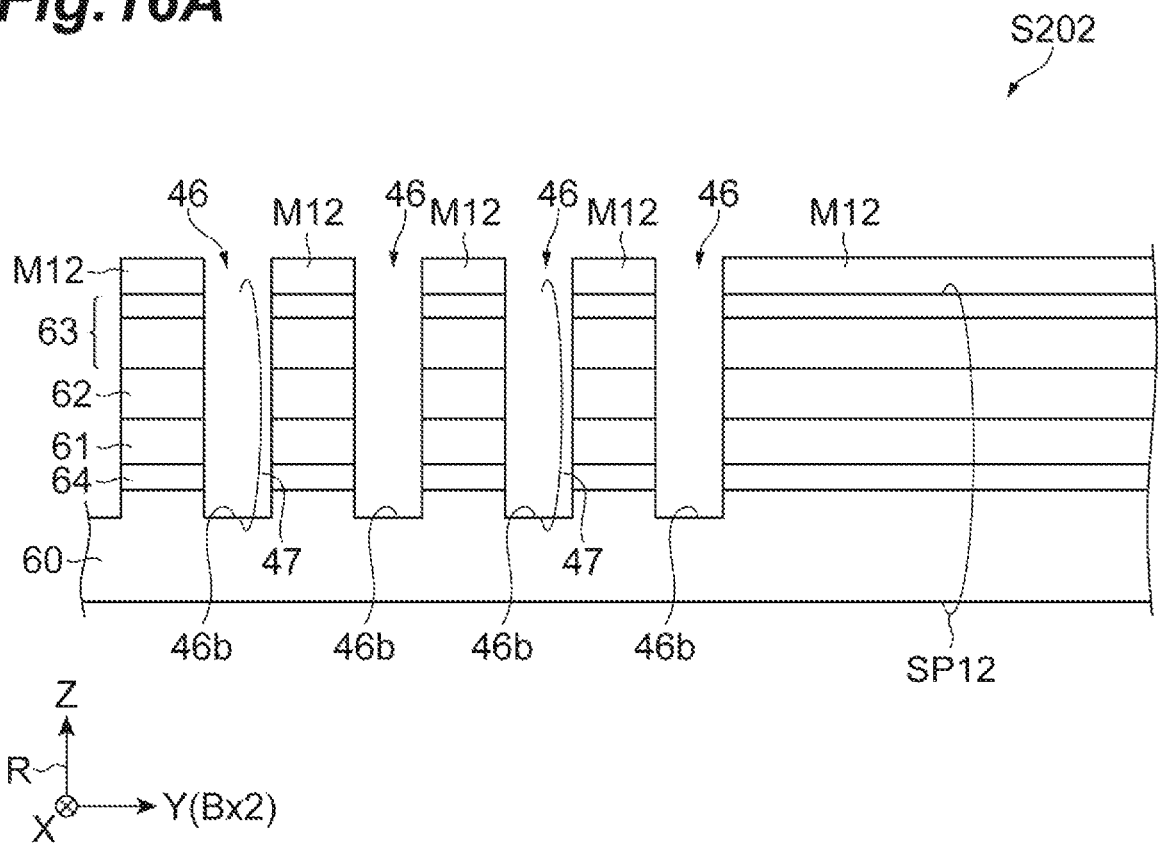
FIG. 16A is a schematic cross sectional view showing a major step in the method according to the embodiment.
Figure 16B:
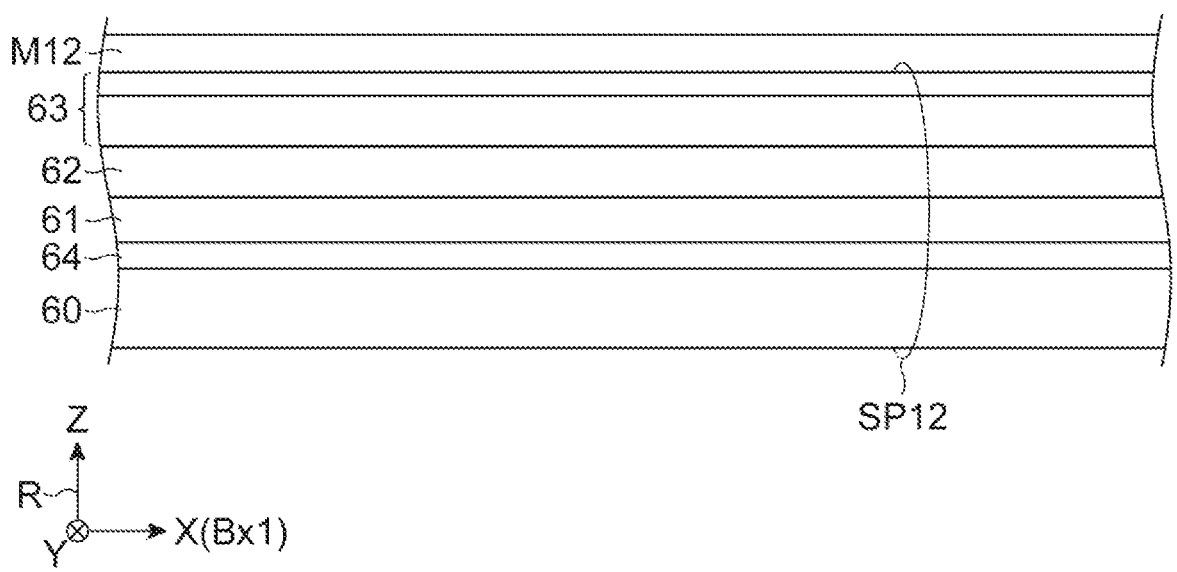
FIG. 16B is a schematic cross sectional view showing a major step in the method according to the embodiment.

In step S202, as shown in FIGS. 16A and 16B, a first etching with the first mask M12 is applied to the epitaxial substrate EP. FIGS. 16A and 16B show the progress of the respective cross sections shown in FIGS. 15A and 15B. In the embodiment, the first etching uses a first etching condition which can provide the first recess portions 46 with a desired depth. Specifically, the first etching allows the first recess portions 46 each to have a bottom 46b in the semiconductor substrate 60. The etching gas in the first etching may include, for example, a halogen gas. After the first etching, the first mask M12 is removed to form the first substrate product SP12.

Figure 17:
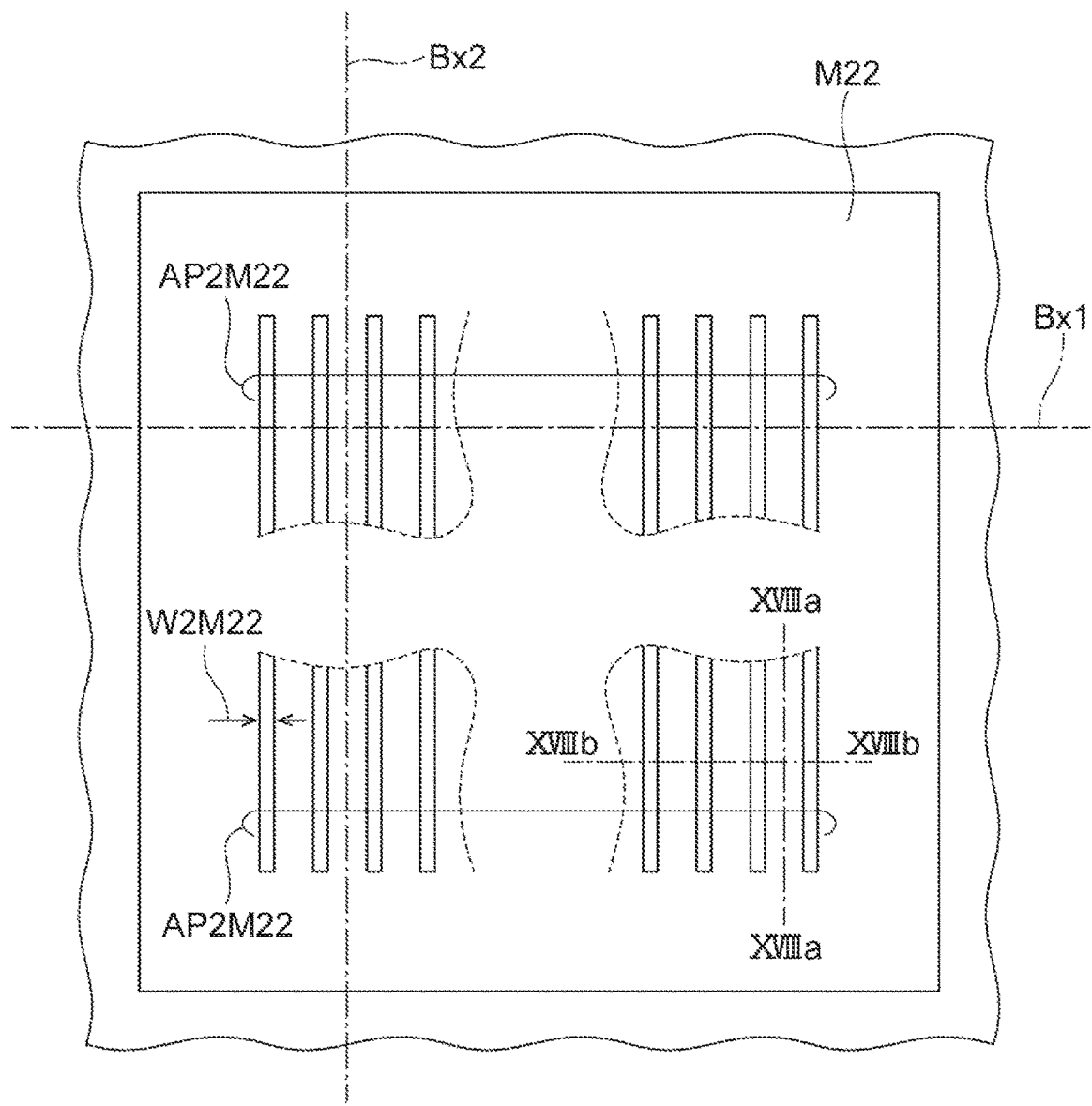
FIG. 17 is a schematic plan view showing a pattern of a second mask in a process of fabricating another infrared light receiving device according to this embodiment.
Figure 18A:
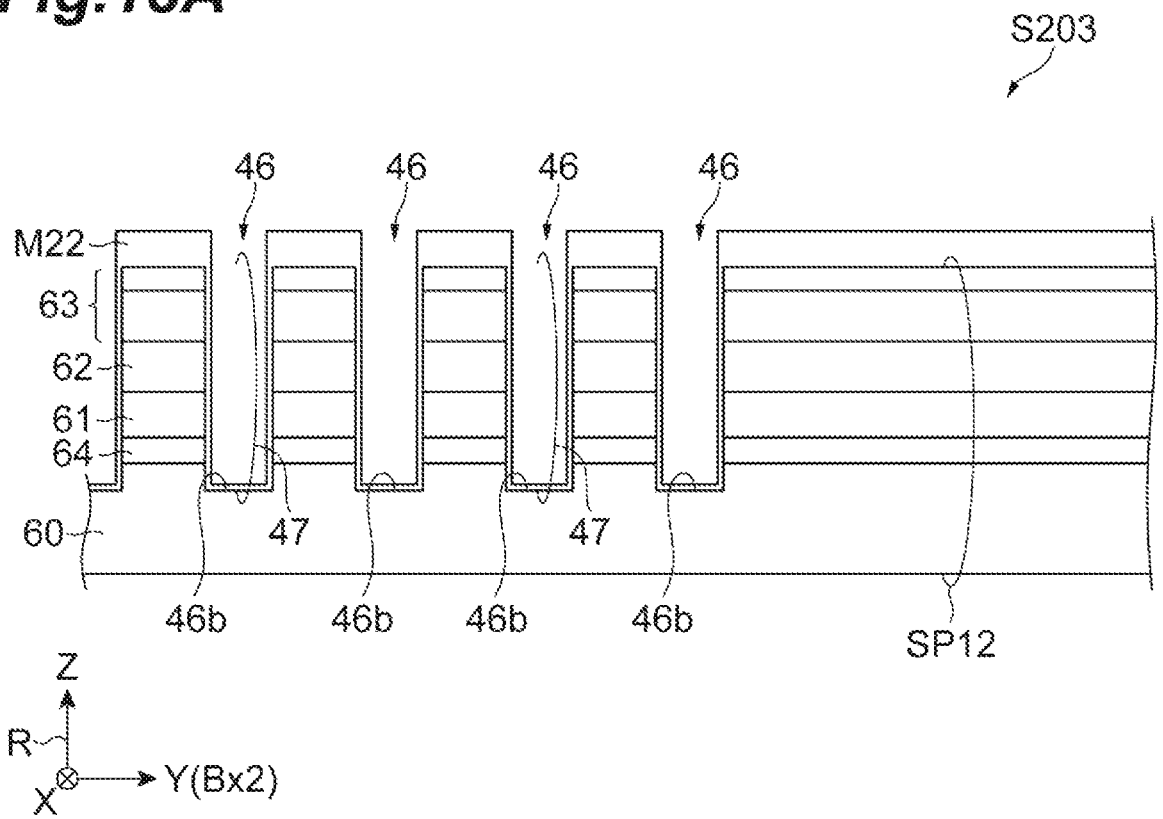
FIG. 18A is a schematic cross sectional view showing a major step in the method according to the embodiment.
Figure 18B:
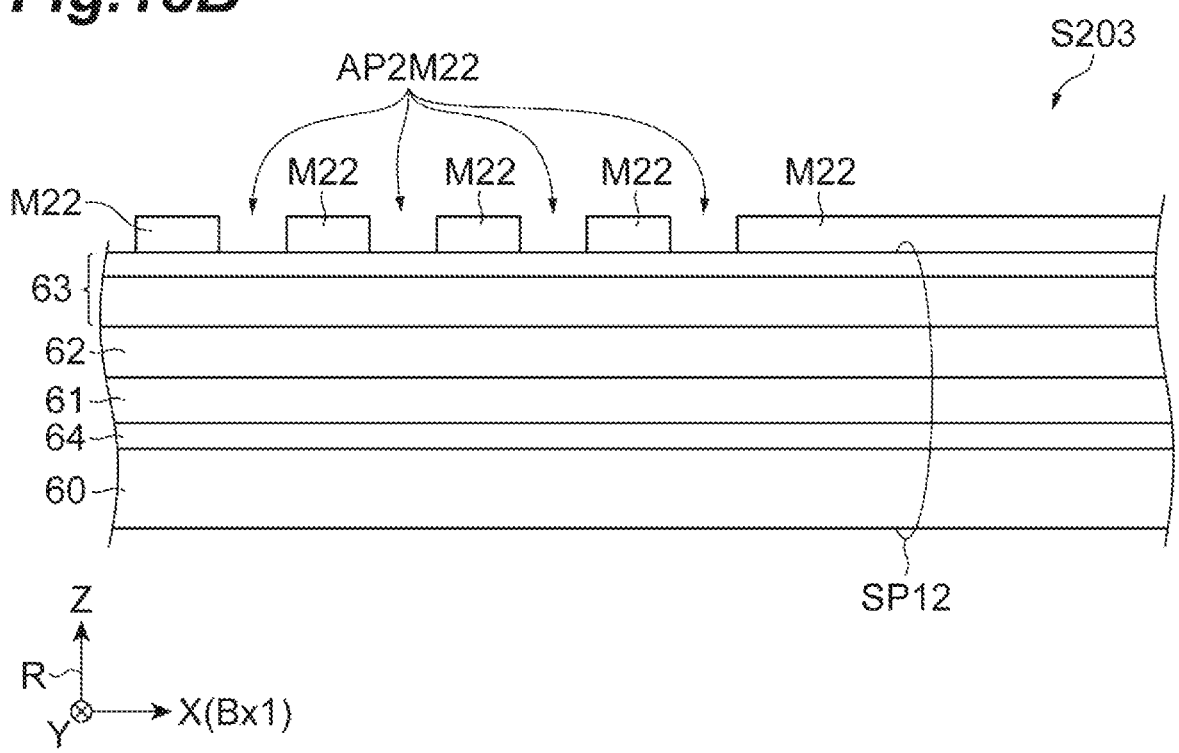
FIG. 18B is a schematic cross sectional view showing a major step in the method according to this embodiment.

In step S203, as shown in FIGS. 17, 18A and 18B, a second mask M22 is formed on the first substrate product SP12. FIGS. 18A and 18B show the progress of the respective cross sections shown in FIGS. 16A and 16B. In the embodiment, the second mask M22 thus formed defines the other grooves of the first and second grooves 47 and 49, for example, the second grooves 49 in the embodiment. FIG. 17 illustrates a pattern of the second mask, which is used in the process of fabricating another infrared light receiving device according to the present embodiment. FIG. 18A is a schematic cross sectional view taken along line XVIIIa-XVIIIa shown in FIG. 17, and FIG. 18B is a schematic cross sectional view taken along line XVIIIb-XVIIIb shown in FIG. 17.

Specifically, the second mask M22 has multiple second openings AP2M22 that define the location of the second recess portions 48. The second openings AP2M22 extend in the direction of the second axis Bx2, and are arranged along the direction of the first axis Bx1. The second openings AP2M22 define the second grooves of the recess 44, which defines the arrayed semiconductor mesas MS for photodiodes.

Width W2M22 of the second openings AP2M22: 0.5 to 5 micrometers

The second mask M22 may include, for example, silicon based inorganic insulator.

Figure 19A:
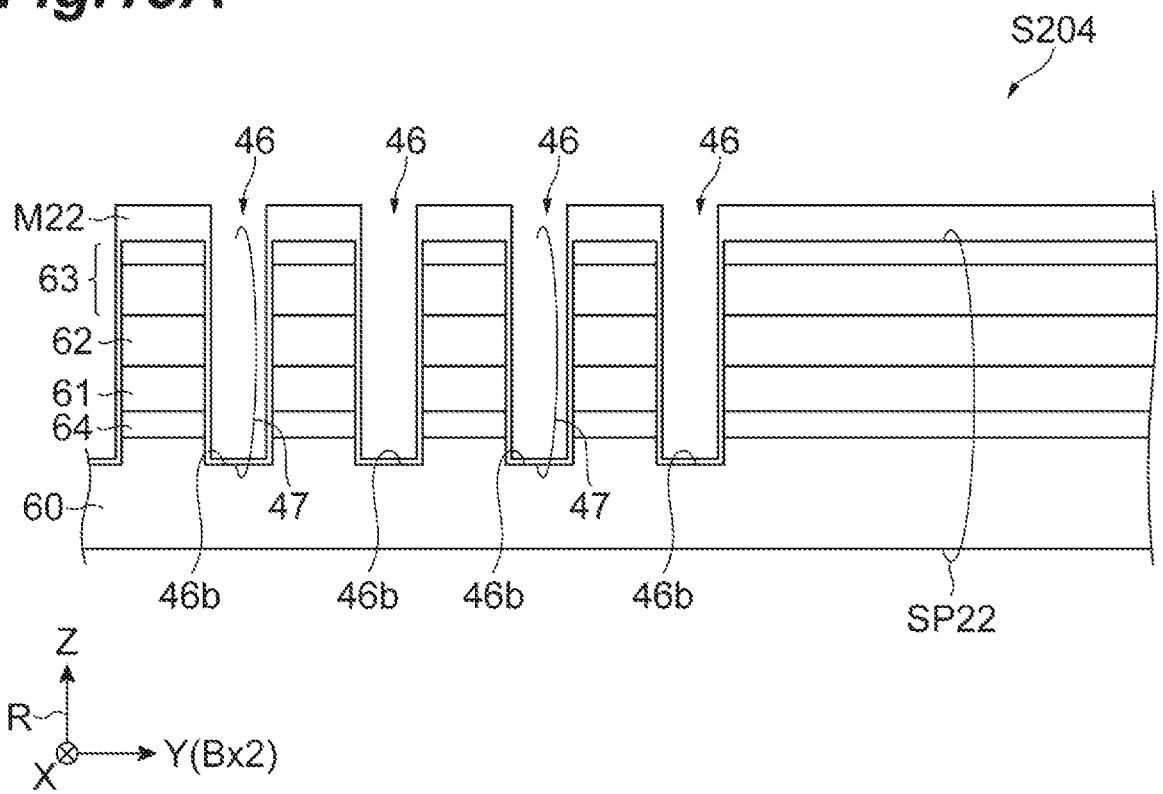
FIG. 19A is a schematic cross sectional view showing a major step in the method according to the embodiment.
Figure 19B:
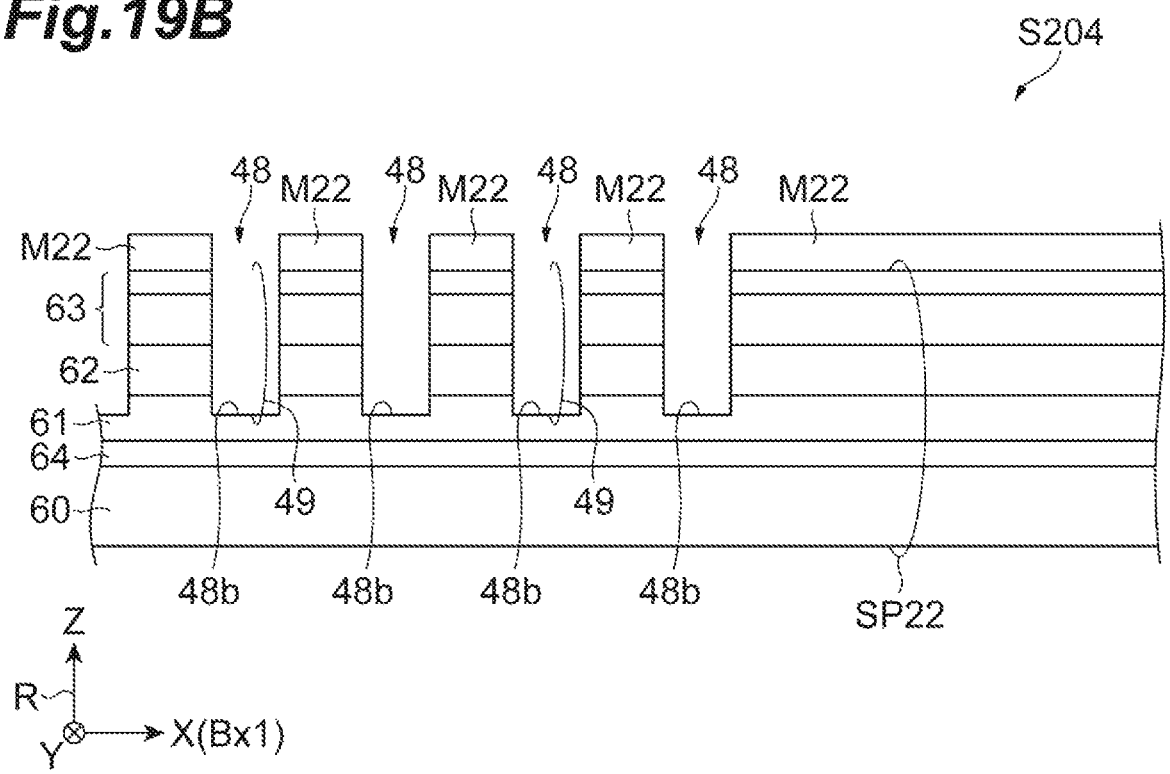
FIG. 19B is a schematic cross sectional view showing a major step in the method according to the embodiment.

In step S204, as shown in FIGS. 19A and 19B, the first substrate product SP12 is processed by a second etching with the second mask M22. FIGS. 19A and 19B show the progress of the respective cross sections shown in FIGS. 18A and 18B. In the embodiment, the second etching uses a second condition which can provide the second recess portions 48 with a desired depth. Specifically, the second etching is stopped in the middle of the first semiconductor layer 61 such that the second recess portions 48 each have a desired depth in the first semiconductor layer 61. After the second etching, the second mask M22 is removed to form a second substrate product SP22. The second substrate product SP22 includes the first and second recess portions 46 and 48.

If possible, the second etching with the second mask M22 may be performed prior to the first etching with the first mask M12.

These processes bring the recess of the infrared light receiving device shown in FIGS. 3A and 3B to completion.

Figure 20A:
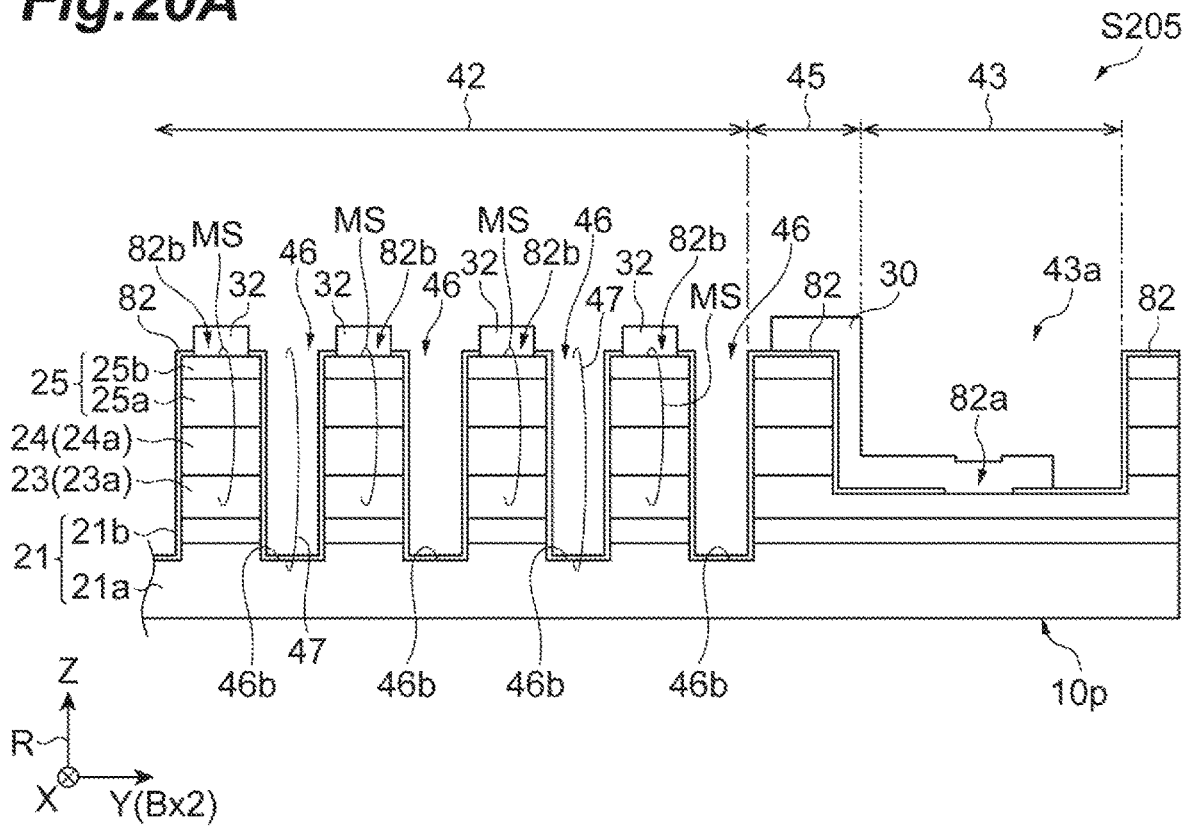
FIG. 20A is a schematic cross sectional view showing a major step in the method according to the embodiment.
Figure 20B:
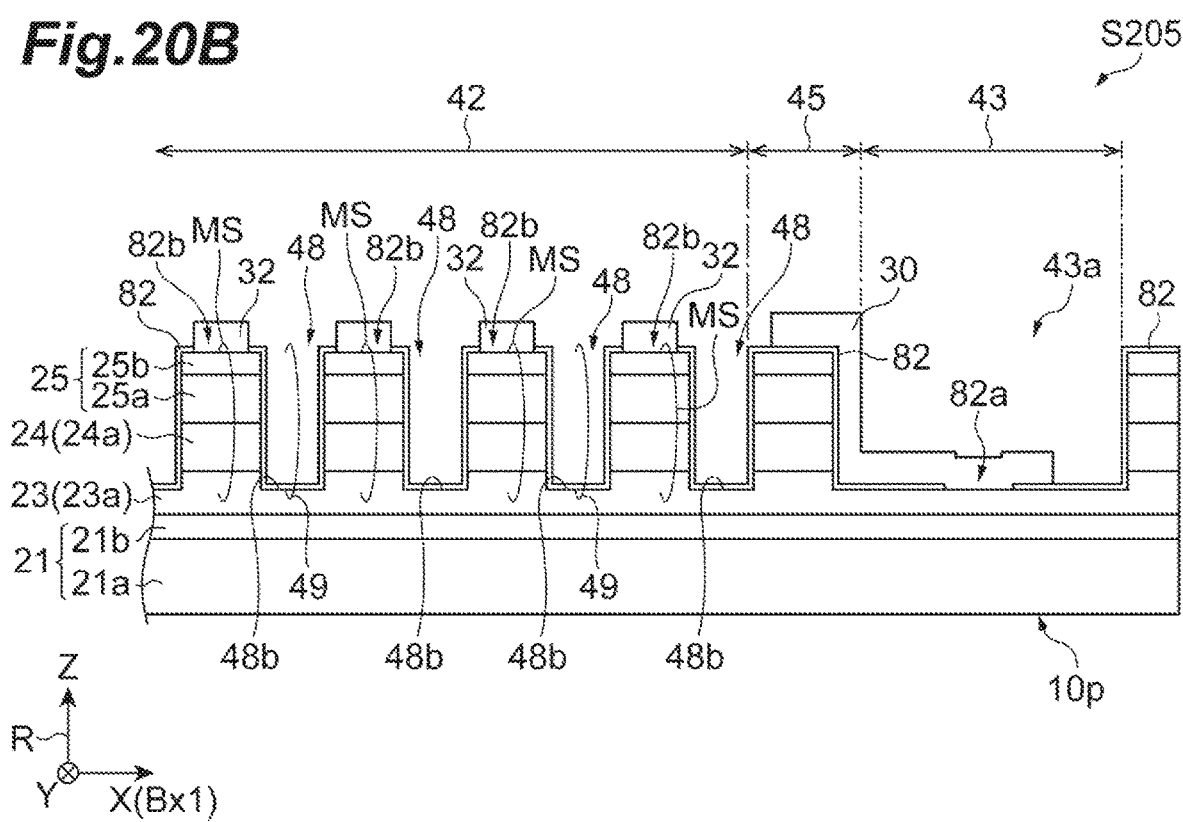
FIG. 20B is a schematic cross sectional view showing a major step in the method according to the embodiment.

In step S205, as shown in FIGS. 20A and 20B, the insulating film 82 is formed, and the first and second electrodes 30 and 32 are formed on the contact structure 43 and the top face of each of the semiconductor mesas MS, respectively. These processes can be carried out in a manner similar to those in FIGS. 11A and 11B, FIGS. 12A and 12B, and FIGS. 13A and 13B. For example, the first and second electrodes 30 and 32 are formed by lift-off. These steps bring the infrared light receiving device 10 to completion.

Having described and illustrated the principle of the invention in a preferred embodiment thereof, it is appreciated by those having skill in the art that the invention can be modified in arrangement and detail without departing from such principles. We therefore claim all modifications and variations coining within the spirit and scope of the following claims.

What is claimed is:

1. An infrared light receiving device comprising:
 a structure having a supporting base and a laminate body, the laminate body including a first superlattice layer, a second superlattice layer and a semiconductor region, the first superlattice layer, the second superlattice layer and the semiconductor region being arranged sequentially on the supporting base, and the laminate body having an array of semiconductor mesas for photodiodes and a recess defining the array of semiconductor mesas; and
 a first electrode connected to the first superlattice layer, the first superlattice layer having an n-type conductivity, the semiconductor region having a p-type conductivity, the first superlattice layer having a type-II superlattice structure and forming a heterojunction with the supporting base,
 the recess having a first recess portion and a second recess portion,
 the second recess portion having a bottom in the first superlattice layer, and
 the first recess portion having a depth larger than that of the second recess portion.

2. The infrared light receiving device according to claim 1, wherein the first recess portion has a bottom in the supporting base.

3. The infrared light receiving device according to claim 1, wherein
 the recess has first grooves each extending in a direction of a first axis and second grooves each extending in a direction of a second axis intersecting the first axis,
 each of the first grooves has a depth allowing the first grooves to form the first recess portion, and
 each of the second grooves has a depth allowing the second grooves to form the second recess portion.

4. The infrared light receiving device according to claim 1, wherein
 the first superlattice layer has strip portions each extending in a direction of a direction of a first axis, and
 the first electrode is connected with the strip portions.

5. A method for fabricating an infrared light receiving device comprising:
 preparing an epitaxial substrate having a substrate and a semiconductor laminate body, the semiconductor laminate body having a first superlattice, a second superlattice and a semiconductor region, and the substrate mounting the semiconductor laminate body; and
 processing the epitaxial substrate by photolithography and etching to form a recess in the epitaxial substrate, the recess defining an array of semiconductor mesas for photodiodes,
 the first superlattice, the second superlattice and the semiconductor region being arranged sequentially on the substrate,
 the first superlattice having an n-type conductivity,
 the semiconductor region having a p-type conductivity,
 the first superlattice having a type-II superlattice structure and forming a heterojunction with the substrate,
 the recess having a first recess portion and a second recess portion,
 the second recess portion having a bottom in the first superlattice, and
 the first recess portion having a depth larger than that of the second recess portion.

6. The method according to claim 5, wherein
 processing the epitaxial substrate by photolithography and etching to form a recess in the epitaxial substrate includes
  forming a first mask on the epitaxial substrate, the first mask having an opening extending in a direction of a first axis,
  forming a third recess portion in the epitaxial substrate by processing the epitaxial substrate with the first mask to obtain a first substrate product, the third recess portion having a depth smaller than that of each of the first recess portion and the second recess portion,
  forming a second mask on the first substrate product, the second mask having a first opening and a second opening, the first opening extending in a direction of a first axis, and the second opening extending in a direction of a second axis intersecting the first axis,
  processing the first substrate product with the second mask to form the first recess portion and the second recess portion in the first substrate product, and
  removing the second mask to obtain a second substrate product having the first recess portion and the second recess portion,
 the first opening and the second opening of the second mask defines positions of the first recess portion and the second recess portion,
 the second mask is aligned such that the first opening thereof is disposed on the opening of the first mask.

7. The method according to claim 5, wherein
 processing the epitaxial substrate by photolithography and etching to form a recess in the epitaxial substrate includes
  forming a first mask on the epitaxial substrate, the first mask having a first opening.
  applying a first etching to the epitaxial substrate with the first mask,
  after applying the first etching to the epitaxial substrate, removing the first mask to form a first substrate product,
  after removing the first mask, forming a second mask on the first substrate product, the second mask having a second opening,
  applying a second etching to the first substrate product with the second mask, and
  after applying the second etching to the first substrate product, removing the second mask to form a second substrate product, one of the first etching and the second etching uses a first etching condition allowing to form the first recess portion, and the other of the first etching and the second etching uses a second etching condition to form the second recess portion.

\* \* \* \* \*